United States Patent
Sasago et al.

(10) Patent No.: US 11,411,028 B2
(45) Date of Patent: Aug. 9, 2022

(54) PHOTOELECTRIC CONVERSION APPARATUS, PHOTOELECTRIC CONVERSION SYSTEM, AND MOVING OBJECT

(71) Applicant: CANON KABUSHIKI KAISHA, Tokyo (JP)

(72) Inventors: Tomoya Sasago, Kawasaki (JP); Yukihiro Kuroda, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 204 days.

(21) Appl. No.: 16/796,799

(22) Filed: Feb. 20, 2020

(65) Prior Publication Data

US 2020/0273895 A1    Aug. 27, 2020

(30) Foreign Application Priority Data

Feb. 27, 2019  (JP) .............................. JP2019-034287

(51) Int. Cl.
  *H01L 27/146*    (2006.01)
  *G06V 20/58*    (2022.01)

(52) U.S. Cl.
  CPC ........ *H01L 27/14612* (2013.01); *G06V 20/58* (2022.01); *H01L 27/1461* (2013.01); *H01L 27/1463* (2013.01); *H01L 27/1464* (2013.01); *H01L 27/14607* (2013.01); *H01L 27/14621* (2013.01); *H01L 27/14627* (2013.01); *H01L 27/14645* (2013.01); *G06V 2201/07* (2022.01)

(58) Field of Classification Search
  CPC ......... H01L 27/14612; H01L 27/14607; H01L 27/1461; H01L 27/14621; H01L 27/14627; H01L 27/1463; H01L 27/1464; H01L 27/14645; H01L 27/14634; H01L 27/14636; G06K 9/00805; G06K 2209/21
  See application file for complete search history.

(56) References Cited

U.S. PATENT DOCUMENTS

| | | | |
|---|---|---|---|
| 6,392,282 B1* | 5/2002 | Sahara | H01L 27/1443 257/186 |
| 2015/0115131 A1 | 4/2015 | Webster | |
| 2017/0031010 A1 | 2/2017 | Suzuki | |
| 2018/0270405 A1 | 9/2018 | Ota | |
| 2019/0252442 A1 | 8/2019 | Tanaka | |

FOREIGN PATENT DOCUMENTS

JP    2019-021826 A    2/2019

* cited by examiner

*Primary Examiner* — Tony Ko
(74) *Attorney, Agent, or Firm* — Canon U.S.A., Inc. IP Division

(57) ABSTRACT

A photoelectric conversion apparatus includes a first diode which is an avalanche multiplication-type and a second diode which is an avalanche multiplication-type formed within a semiconductor substrate, a first transistor forming a first quench element, and a second transistor forming a second quench element. The first transistor and the second transistor are disposed between the first diode and the second diode in a planar view. The first transistor and the second transistor are disposed in a common semiconductor well region formed within the semiconductor substrate.

19 Claims, 19 Drawing Sheets

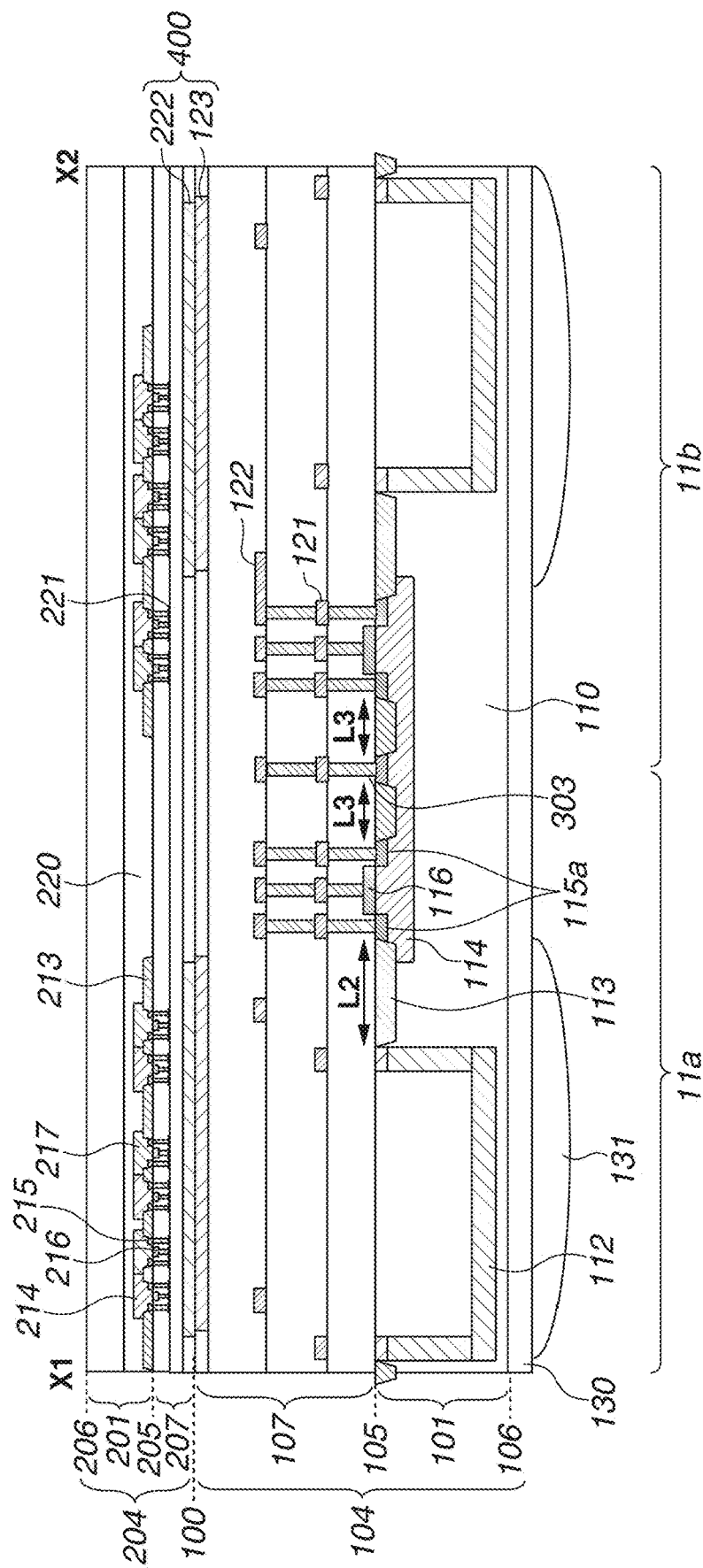

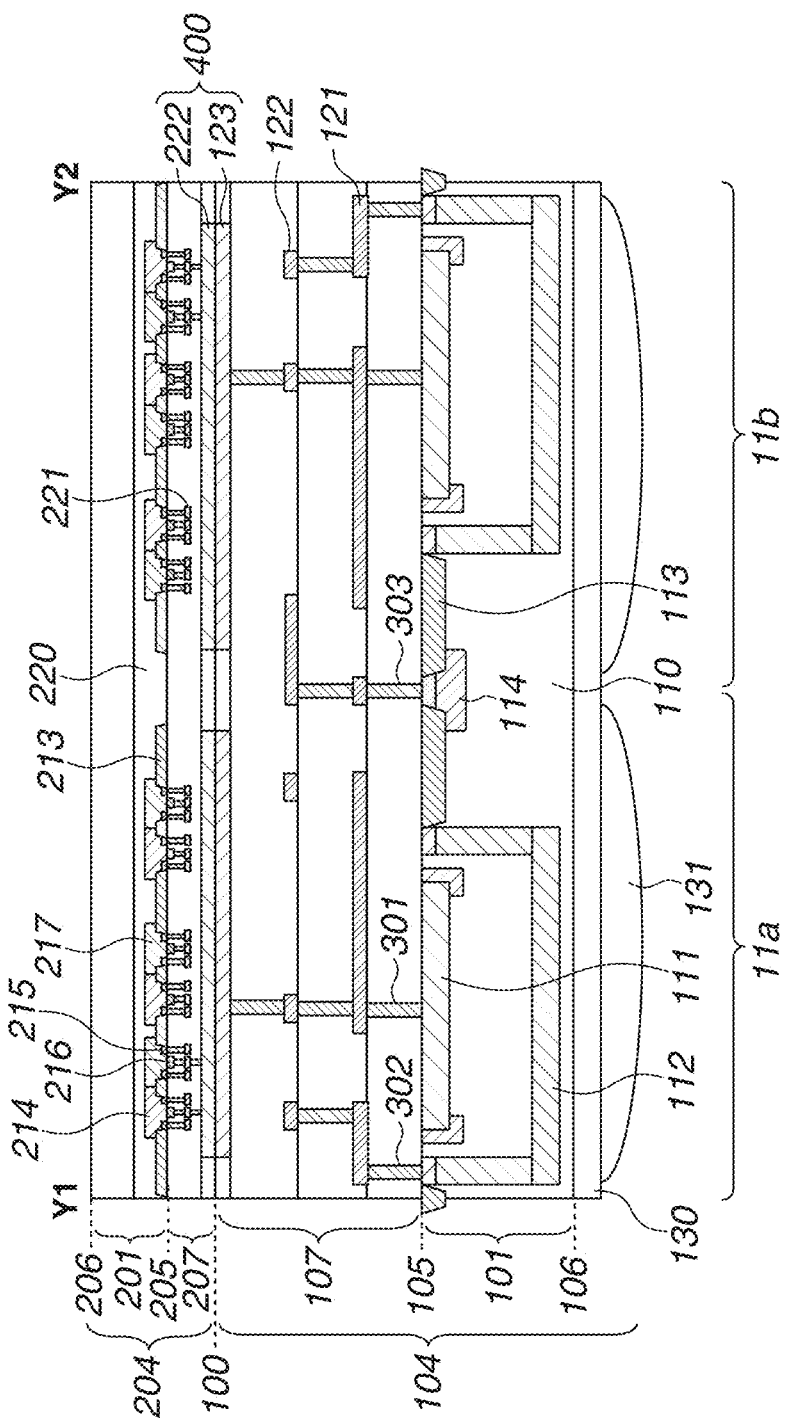

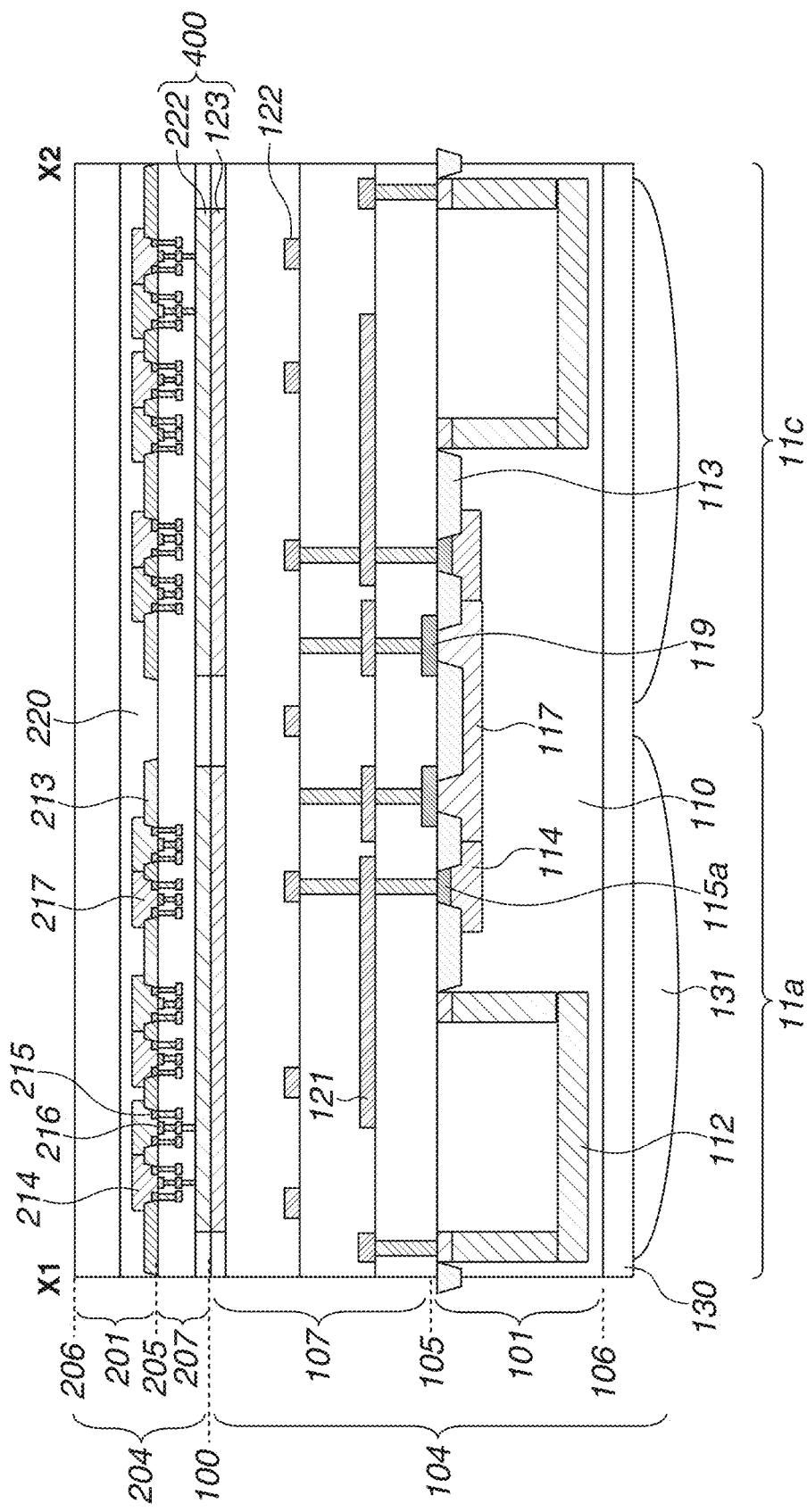

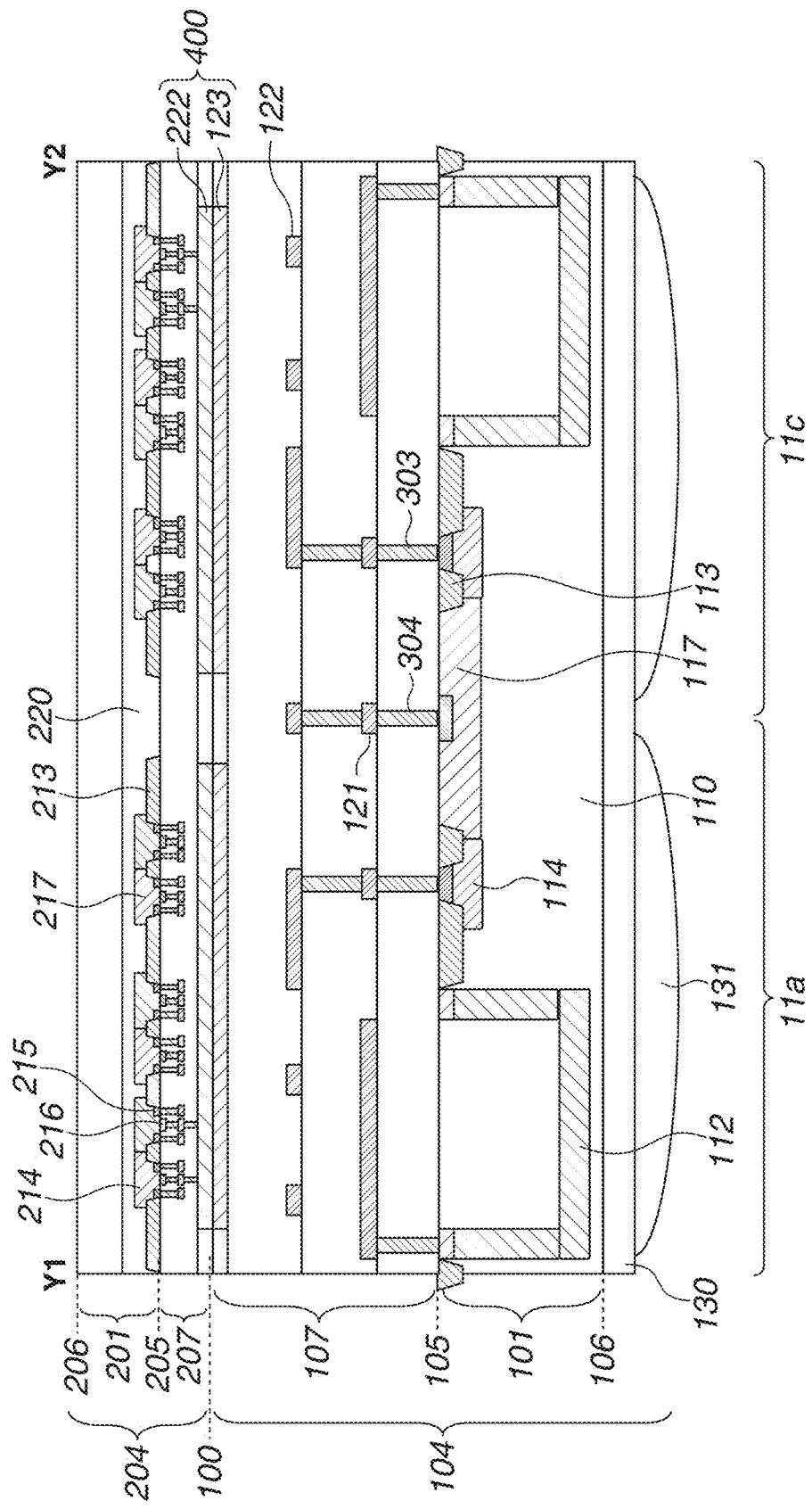

though exaggerated to make
the description clear. In the following description, similar
configurations may be identified by the same reference
numerals and descriptions thereof may be omitted.

PHOTOELECTRIC CONVERSION APPARATUS, PHOTOELECTRIC CONVERSION SYSTEM, AND MOVING OBJECT

BACKGROUND OF THE INVENTION

Field of the Invention

The present disclosure relates to a photoelectric conversion apparatus, a photoelectric conversion system, and a moving object.

Description of the Related Art

Conventionally, there a photoelectric conversion apparatus has been known that includes a single photon avalanche diode (SPAD). The SPAD is an element that counts the number of incident photons by detecting an avalanche current that has occurred due to entry of a single photon to an avalanche photodiode (hereinafter referred to as a diode). A reverse bias voltage equal to or higher than a breakdown voltage is applied to the diode, and the current is multiplied due to the avalanche multiplication. A photoelectric conversion apparatus including the SPAD counts the number of times that the current multiplied in the avalanche multiplication (hereinafter referred to as the "avalanche current") exceeds a threshold value.

United States Patent Publication Application No. 2015/0115131 discusses the photoelectric conversion apparatus including the SPAD, and discloses a configuration in which the APD and a quench element are mixed in the same semiconductor substrate in FIG. 2A. The quench element returns an operational region of the APD to a potential that causes the avalanche multiplication after stopping the avalanche multiplication.

However, United States Patent Publication Application No. 2015/0115131 fails to conduct a study on a layout of the quench element and the diode when the diode and the quench element are mixed in the same substrate.

SUMMARY OF THE INVENTION

The present disclosure is directed to achieving high integration of diodes in a photoelectric conversion apparatus in which a quench element includes a transistor and the diode and the quench element are mixed in the same substrate.

According to an aspect of the present disclosure, a photoelectric conversion apparatus includes a first semiconductor substrate, a first diode which is an avalanche multiplication-type and a second diode which is an avalanche multiplication-type formed within the first semiconductor substrate, a first transistor forming a first quench element connected to the first diode, and a second transistor forming a second quench element connected to the second diode. The first transistor and the second transistor are disposed between the first diode and the second diode in a planar view. A part of the first transistor and a part of the second transistor are disposed in a common first semiconductor well region formed in the first semiconductor substrate.

Further features of the present disclosure will become apparent from the following description of exemplary embodiments with reference to the attached drawings.

BRIEF DESCRIPTION OF THE DRAWINGS

FIGS. 6A and 6B each illustrate a cross-sectional structure of the photoelectric conversion apparatus according to the first exemplary embodiment.

FIGS. 9A, 9B, and 9C each illustrate a cross-sectional structure of the photoelectric conversion apparatus according to the second exemplary embodiment.

DESCRIPTION OF THE EMBODIMENTS

Figure 1:
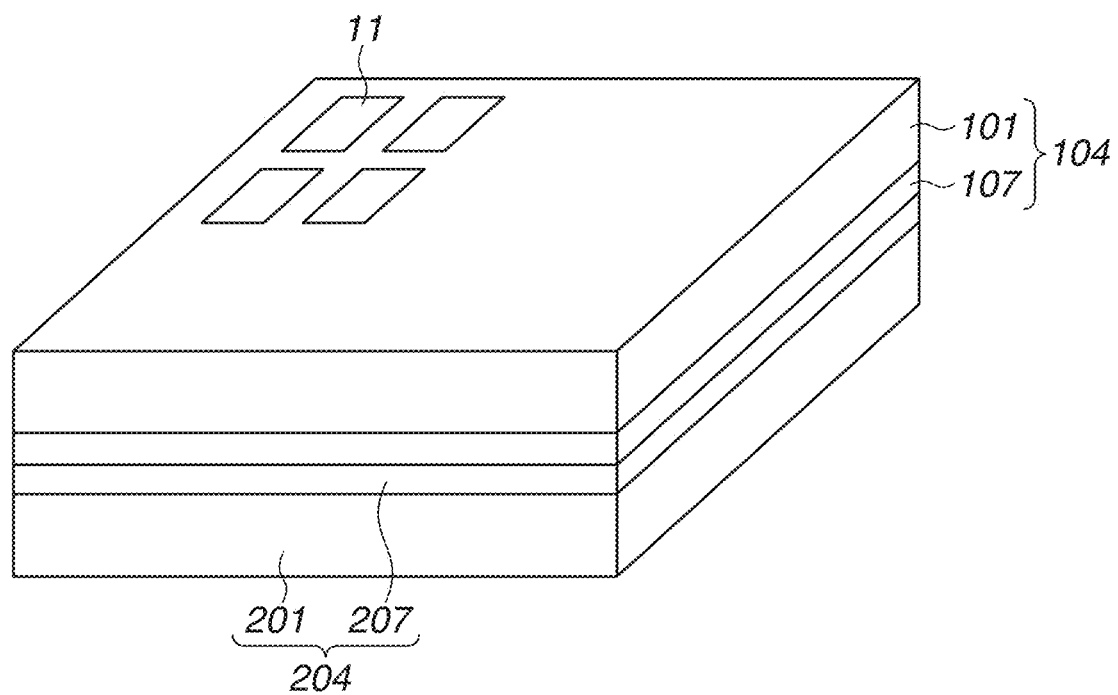
FIG. 1 illustrates a configuration of a photoelectric conversion apparatus according to a first exemplary embodiment.

Exemplary embodiments that will be described below are intended to embody a technical idea of the present disclosure, and are not intended to limit the present disclosure thereto. Sizes and a positional relationship of members illustrated in each of drawings may be exaggerated to make the description clear. In the following description, similar configurations may be identified by the same reference numerals and descriptions thereof may be omitted.

In the following description, assume that an electron is used as a signal carrier. A negative (N-type) semiconductor region corresponds to a semiconductor region of a first conductivity type in which carriers having a first polarity serve as majority carriers, and a positive (P-type) semiconductor region corresponds to a semiconductor region of a second conductivity type in which carriers having a second polarity serve as majority carriers. A metal-oxide-semiconductor (MOS) transistor of the first conductivity type refers to a MOS transistor having an N-type source and drain. When a hole is used as the signal carrier, the semiconductor region of the first conductivity type becomes the P-type semiconductor region, and the semiconductor region of the second conductivity type becomes the N-type semiconductor region. The present disclosure is applicable even to this case.

A semiconductor substrate in each of the exemplary embodiments that will be described below includes a semiconductor substrate in a wafer state, in addition to a semiconductor substrate in the form of a small piece that is cut from a wafer into a plurality of chips. Each of the drawings illustrates the chip state in the form of the small piece that is cut from the wafer state.

In each of the exemplary embodiments that will be described below, a surface of the semiconductor substrate on one side where a wiring layer is formed may be referred to as a front surface, and a surface of the semiconductor substrate on a side opposite to the one where the wiring layer is formed may be referred to as a back surface for convenience.

FIG. 1 schematically illustrates a photoelectric conversion apparatus according to a first exemplary embodiment. The photoelectric conversion apparatus includes two-dimensionally arrayed unit pixels 11. The photoelectric conversion apparatus is structured in such a manner that a first semiconductor substrate 101 and a second semiconductor substrate 201 are stacked. A photoelectric conversion region of the unit pixel 11 is formed in the first semiconductor substrate 101. A readout circuit of the unit pixel 11 is formed in the second semiconductor substrate 201. Further, a first wiring portion 107 is disposed between the first semiconductor substrate 101 and the second semiconductor substrate 201, and a second wiring portion 207 is disposed between the first wiring portion 107 and the second semiconductor substrate 201. Hereinafter, a member formed by the first semiconductor substrate 101 and the first wiring portion 107 will be referred to as a first component 104, and a member formed by the second semiconductor substrate 201 and the second wiring portion 207 will be referred to as a second component 204.

The photoelectric conversion apparatus according to the present exemplary embodiment is a so-called back-side-illuminated photoelectric conversion apparatus, on which light is incident from the surface on the side opposite to the surface where the first wiring portion 107 is disposed in the first semiconductor substrate 101. However, the present disclosure is not limited to such a structure. For example, the photoelectric conversion apparatus may be a so-called front-side-illuminated photoelectric conversion apparatus, on which light is incident from the surface on which the wiring portion 107 is disposed. Further, the present disclosure also covers a photoelectric conversion apparatus in which the first semiconductor substrate 101 includes all the photoelectric conversion regions and the readout circuits of the unit pixel 11, and is not stacked on the second semiconductor substrate 201.

Figure 2:
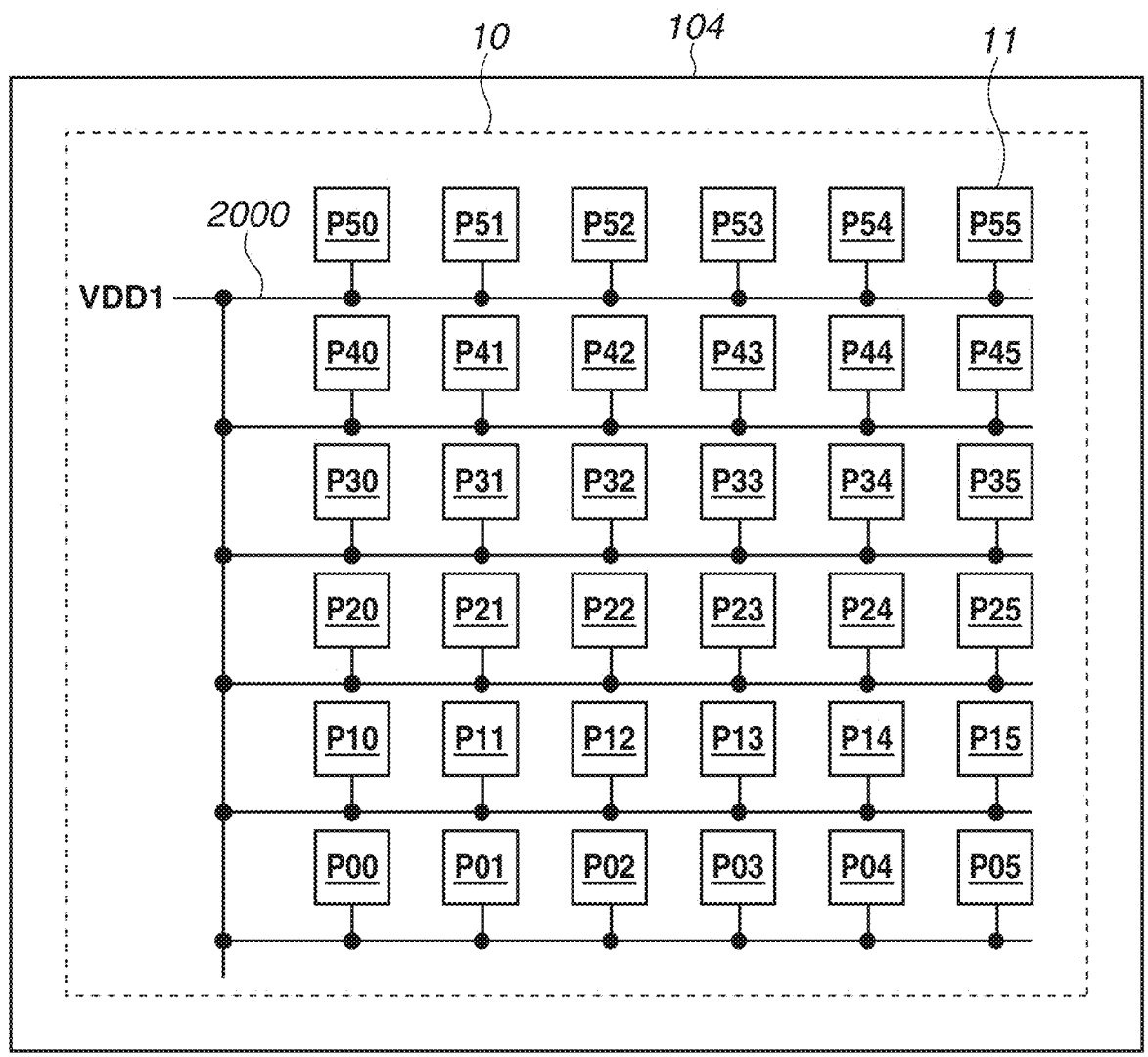
FIG. 2 is a plan view of a first component of the photoelectric conversion apparatus according to the first exemplary embodiment.

FIG. 2 illustrates a configuration of the first component 104. A sensor portion 10 is provided in the first semiconductor substrate 101. First portions of the plurality of unit pixels 11 are two-dimensionally formed in the sensor portion 10. As will be described in detail below, the unit pixels 11 each include an avalanche multiplication-type diode and a pixel circuit, and output a signal according to entry of the light thereon. The pixel circuit refers to a quench element, an inverter circuit, and the like. FIG. 2 illustrates the sensor portion 10 in which first portions P00 to P55 of the unit pixels 11 are laid out in six rows and six columns.

In the present exemplary embodiment, a voltage VDD1 is applied from a power source line 2000 to the quench element included in the first portion of each of the unit pixels 11.

Figure 3:
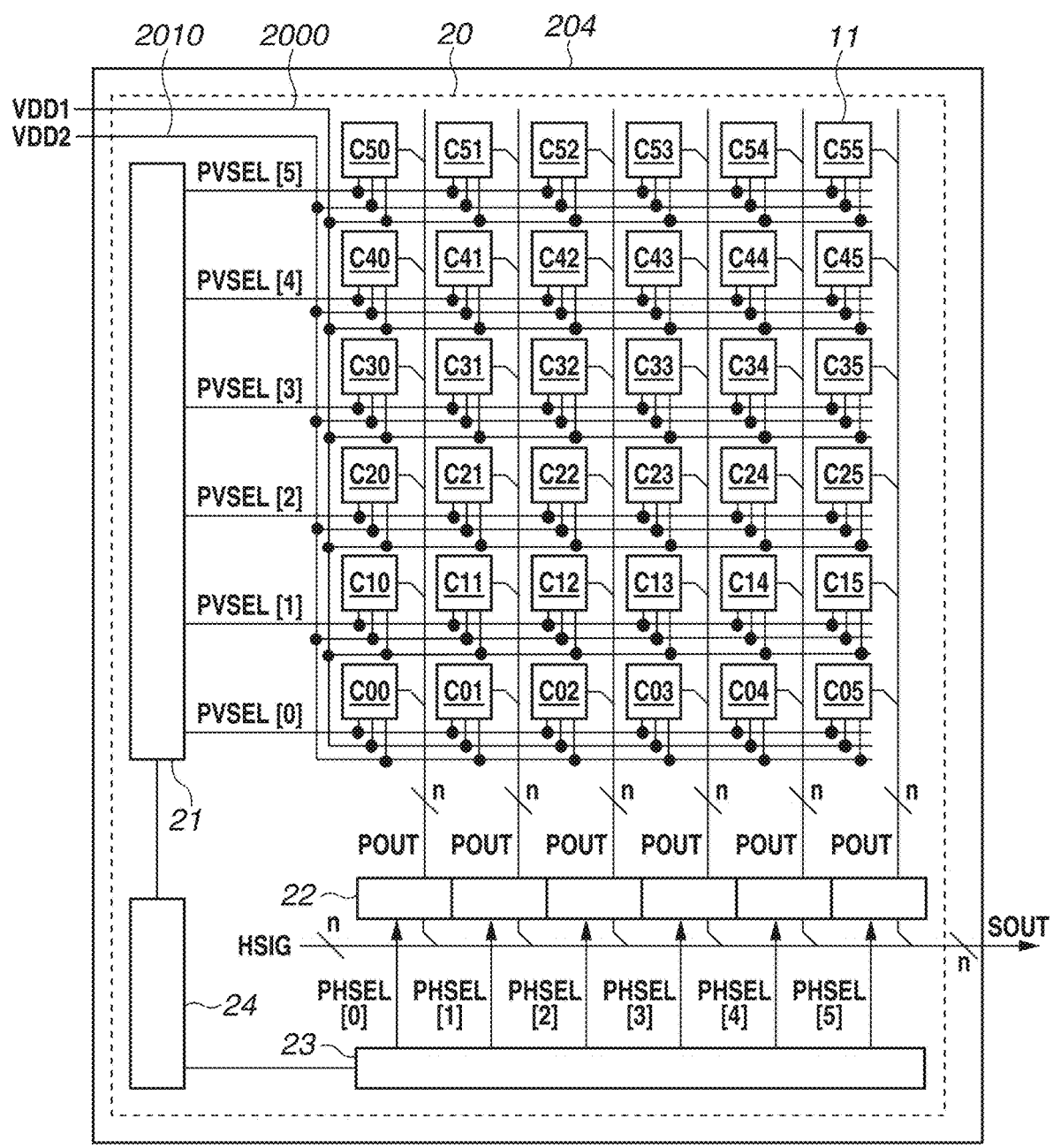
FIG. 3 is a plan view of a second component of the photoelectric conversion apparatus according to the first exemplary embodiment.

FIG. 3 illustrates a configuration of the second component 204. A circuit portion 20 is provided in the second semiconductor substrate 201. Second portions of the plurality of unit pixels 11 are two-dimensionally formed in the circuit portion 20. The voltage VDD1 and a voltage VDD2 are supplied to the second portion of each of the unit pixels 11. FIG. 3 illustrates the circuit portion 20 in which second portions C00 to C55 of the unit pixels 11 are laid out in the six rows and six columns.

The second portions C00 to C55 of the unit pixels 11 each include at least a circuit that processes a signal output from the diode. In the present exemplary embodiment, each of the second portions C00 to C55 is formed by the inverter circuit.

The circuit portion 20 further includes a vertical selection circuit 21, which drives the unit pixels 11, signal processing circuits 22, which process the signals output from the unit pixels 11, a horizontal selection circuit 23, which is used to read out the signals from the signal processing circuits 22, and a control circuit 24, which controls an operation of each of the circuits. In FIG. 3, a signal line that supplies a signal from the vertical selection circuit 21 is referred to as PVSEL, an output signal line that outputs the signal from each of the unit pixels 11 is referred to as POUT, and a signal line that supplies a signal from the horizontal selection circuit 23 is referred to as PHSEL. Further, a signal output line from the signal processing circuits 22 is referred to as SOUT. As described above, the voltage VDD1 is applied from the power source line 2000 and the voltage VDD2 is applied from the power source line 2010 to the second portions C00 to C55 of the unit pixels 11 laid out in the circuit portion 20.

Each of the plurality of signal processing circuits 22 is provided corresponding to each of individual columns formed by the plurality of unit pixels 11. The signal processing circuits 22 have a function of holding the signals output from the unit pixels 11. A plurality of output signal lines (n output signal lines in FIG. 3) is connected to one unit pixel 11. Therefore, the signal processing circuit 22 corresponding to each of the columns can hold a plurality of signals output from the one unit pixel 11.

Equivalent Circuit Diagram

Figure 4:
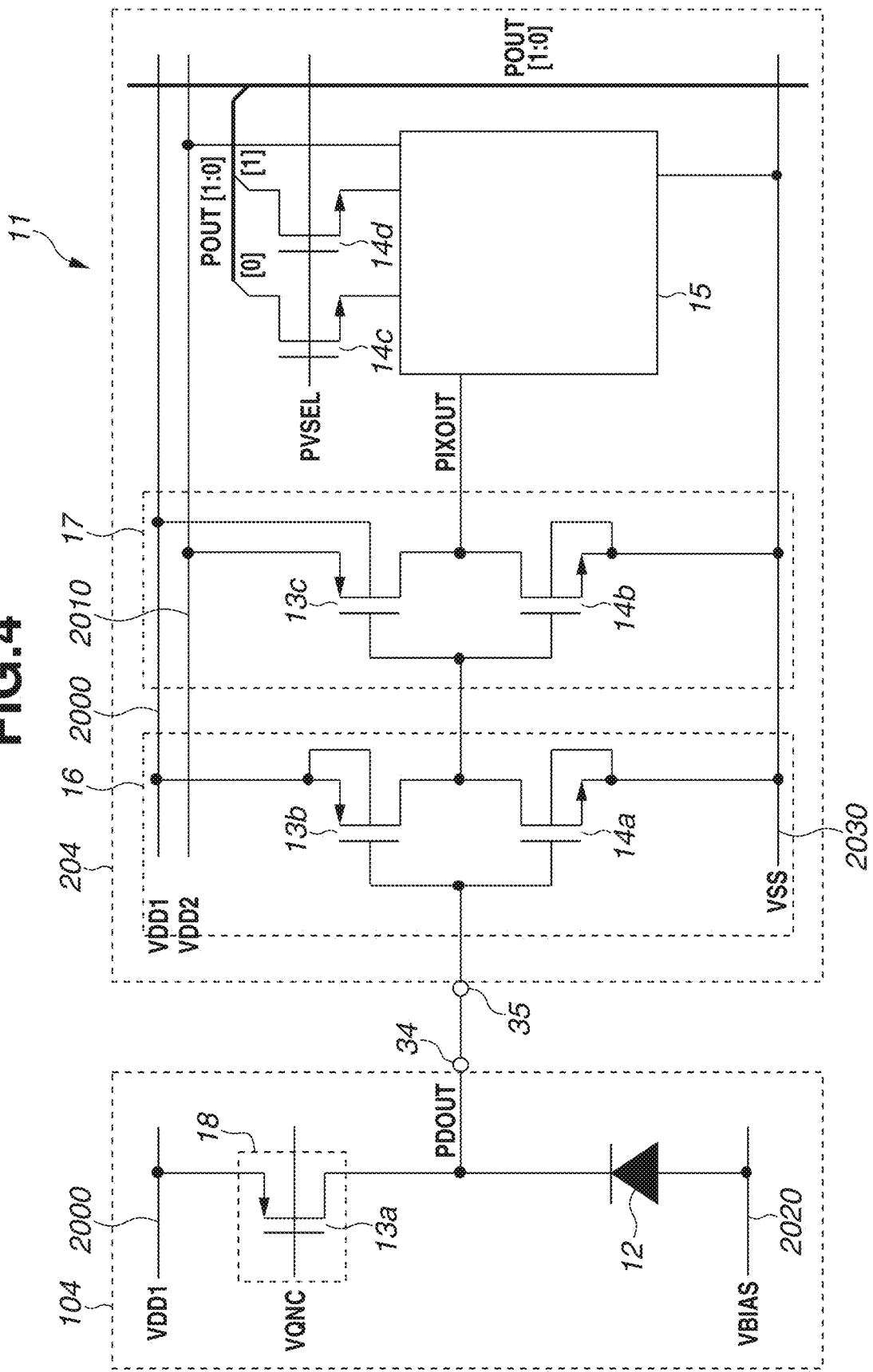
FIG. 4 is an equivalent circuit of the photoelectric conversion apparatus according to the first exemplary embodiment.

FIG. 4 is an equivalent circuit diagram illustrating an example of a configuration of the unit pixel 11. In FIG. 4, the unit pixel 11 includes an avalanche multiplication-type diode 12, a quench element 18, inverter circuits 16 and 17, and a counter circuit 15.

A reverse bias voltage equal to or higher than a breakdown voltage is applied to the diode 12, and the diode 12 is set so as to operate in a Geiger mode. More specifically, a voltage VBIAS (a first power source voltage) is applied from a power source line 2020 and the voltage VDD1 (a second power source voltage) is applied from the power source line 2000 to an anode side and a cathode side of the diode 12, respectively, and the voltages VBIAS and VDD1 have a voltage difference therebetween that is equal to or higher than the breakdown voltage. For example, the first power source voltage is −20 V and the second power source voltage is 3.3 V. In a state where an avalanche current has not occurred, VDD1 is supplied to the cathode side via a P-type MOS (PMOS) transistor 13a. In the present disclosure, the "power source voltage" refers to a voltage supplied to each of the power source lines 2000 and 2020. Basically, the voltage of the power source voltage is supplied to the diode 12, the inverter circuit 16, and the like.

The PMOS transistor 13a is the quench element 18, and forms predetermined quenching resistance based on a voltage VQNC. When a photon is incident on the diode 12, a plurality of electrons (and holes) are generated and a photocurrent is multiplied due to the avalanche phenomenon. The current multiplied due to the avalanche phenomenon flows to the cathode of the diode 12 and a connection node between the quench element 18 and the inverter circuit 16. A voltage drop due to this current causes a reduction in a potential at the cathode, and the avalanche phenomenon does not arise in the diode 12. In other words, an operational region of the diode 12 is brought out of the Geiger mode. After that, the voltage VDD1 is supplied to the cathode of the diode 12 via the quench element 18, so that the voltage supplied to the cathode of the diode 12 returns to the voltage VDD1. In other words, the operational region of the diode 12 is brought into the Geiger mode again.

An output PDOUT from the diode 12 is transmitted to the second component 204 and input to the inverter circuit 16 via a first connection portion 34 and a second connection portion 35.

A PMOS transistor 13b and an N-type MOS (NMOS) transistor 14a form the inverter circuit 16. The cathode of the diode 12 is connected to the inverter circuit 16, so that the output of the inverter circuit 16 is switched to a low level when the potential at the cathode of the diode 12 is equal or higher than a threshold value of the inverter circuit 16. On the other hand, the output of the inverter circuit 16 is switched to a high level when the potential at the cathode of the diode 12 is lower than the threshold value of the inverter circuit 16. In other words, the output of the inverter circuit 16 is binarized. As a result, the unit pixel 11 can shape the signal into a rectangular pulse signal indicating whether a photon is incident using the inverter circuit 16. Hereinafter, the inverter circuit 16 will also be referred to as a "pulse shaping circuit".

In the present exemplary embodiment, the signal output from the inverter circuit 16 is input to the inverter circuit 17. A PMOS transistor 13c and an NMOS transistor 14b form the inverter circuit 17. As will be described in detail below, the inverter circuit 17 brings an amplitude of the pulse signal output from the inverter circuit 16 close to an amplitude of a pulse signal of the counter circuit 15, which will be described below. An inverted signal of the output of the inverter circuit 16 is input to the counter circuit 15.

The counter circuit 15 counts the number of pulses output from the inverter circuit 17, and outputs a cumulated count result to the output signal line POUT via a switch of an NMOS transistor 14c and an NMOS transistor 14d. In other words, when the pulse signal is received from the inverter circuit 17, the counter circuit 15 changes the count value. As described above, the inverter circuit 16 generates the pulse based on the presence/absence of the avalanche current occurring due to the avalanche phenomenon, and the inverter circuit 17 outputs the rectangular pulse based on the pulse of the inverter circuit 16. In other words, the inverter circuit 17 generates the pulse based on the presence/absence of the avalanche current. Then, the rectangular pulse output from the inverter circuit 17 is input to the counter circuit 15. Therefore, the counter circuit 15 counts the number of times that the avalanche current has occurred, which is caused based on whether a photon is incident.

The NMOS transistor 14c and the NMOS transistor 14d are controlled to be switched ON/OFF according to control of the voltage applied to the signal line PVSEL. FIG. 4 illustrates the unit pixel 11 when the bit number of the counter circuit 15 is two bits as an example.

The voltage VDD1 applied to the quench element 18 (the second power source voltage) should be a high voltage from a viewpoint of the Geiger mode operation of the diode 12. For example, when the voltage VBIAS supplied to the power source line 2020 (the first power source voltage) is −20 V, the voltage VDD1 (the second power source voltage) should be set to 3.3 V as described above. Further, the voltage to be supplied to the inverter circuit 16 should also be adjusted so as to match an amplitude of an analog signal from the quench element 18. The PMOS transistor 13a of the quench element 18 is in an ON state on account of the voltage VQNC. Therefore, when no photon is incident, the potential is kept at VDD1 at the cathode terminal of the diode 12. Due to the avalanche phenomenon in the diode 12 in reaction to the photon entry, a high current flows in the PMOS transistor 13a. At this time, the potential at the cathode terminal of the diode 12 undergoes a voltage drop, and an amplitude thereof depends on the characteristics of the diode 12 and the PMOS transistor 13a and varies widely. Therefore, a gate breakdown may occur at the inverter circuit 16. Therefore, the voltage to be supplied to the inverter circuit 16 should be set to a high voltage to surely shape the signal into the pulse signal indicating whether a photon is incident using the inverter circuit 16. In the present exemplary embodiment, the unit pixel 11 is configured such that the voltage to be supplied to the inverter circuit 16 is supplied from the power source line 2000, and the voltage VDD1 is applied to the inverter circuit 16. For example, the voltage VDD1 is 3.3 V, and a voltage VSS of the power source line 2030 is 0 V.

On the other hand, a transistor of a smaller size than the transistors forming the quench element 18 and the inverter circuit 16, i.e., a transistor driven under a low voltage is used as a transistor forming the counter circuit 15 in consideration of the number of elements forming the circuit and an operational speed. More specifically, the voltage VSS (a third power source voltage) is supplied from the power source line 2030 and the voltage VDD2 (a fourth power source voltage) is supplied from the power source line 2010 to the counter circuit 15. Therefore, the pulse signal at the counter circuit 15 has an amplitude corresponding to a difference between the third power source voltage and the fourth power source voltage. For example, when the voltage VSS is 0 V and the voltage VDD2 is 1.8 V, the pulse signal has an amplitude of 1.8 V.

The voltage VSS (a fifth power source voltage) is supplied from the power source line 2030 and the voltage VDD1 (a sixth power source voltage) is supplied from the power source line 2000 to the inverter circuit 16. Therefore, the pulse signal output from the inverter circuit 16 has an amplitude corresponding to a difference between the fifth power source voltage and the sixth power source voltage. For example, when the voltage VSS is 0 V and the voltage VDD1 is 3.3 V, the pulse signal output from the inverter circuit 16 has an amplitude of 3.3 V.

The amplitude of the pulse signal at the counter circuit 15 (for example, 1.8 V) and the amplitude of the pulse signal output from the inverter circuit 16 (for example, 3.3 V) have different values from each other. When the counter circuit 15 is formed by using the transistor that operates under a low voltage for the miniaturization and the speedup, it is desirable that the amplitudes of these pulse signals match each other as close as possible from the viewpoint of pressure resistance and reliability. Accordingly, the present exemplary embodiment converts the pulse signal having a first amplitude that is output from the inverter circuit 16 into the pulse signal having a second amplitude lower than the first amplitude by providing the inverter circuit 17. Because of such a function, the inverter circuit 17 will also be referred to as a "pulse conversion circuit".

For example, suppose that the voltage VSS of the power source line 2030 that is supplied to the inverter circuit 17 (a seventh power source voltage) is 0 V, and the voltage VDD2 of the power source line 2010 (an eighth power source voltage) is 1.8 V. In this case, the amplitude of the pulse signal is converted from 3.3 V into 1.8 V between before and after the input to the inverter circuit 17. Since the amplitude of the pulse signal at the counter circuit 15 is, for example, 1.8 V as described above, if the inverter circuit 17 is provided, an appropriate value can be set as the amplitude of the pulse signal to be input to the counter circuit 15.

Planar View and Cross-Sectional View

Figure 5A:
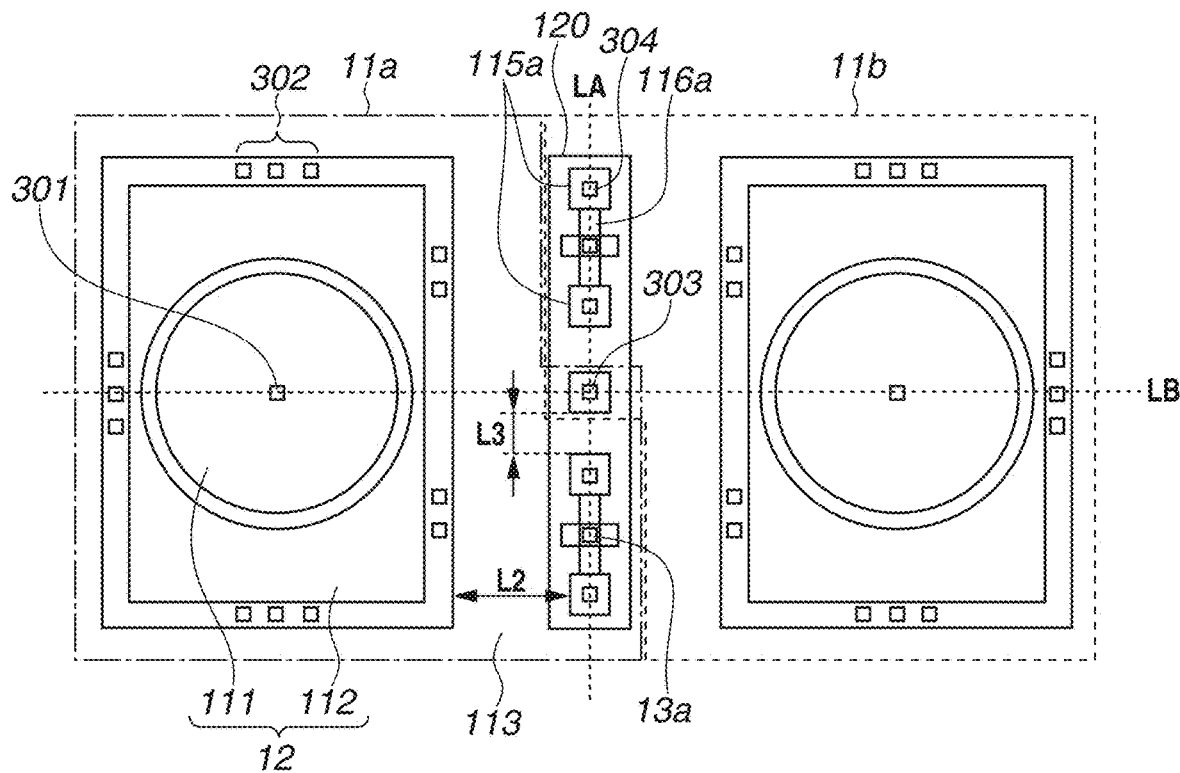
FIGS. 5A and 5B each illustrate a planar structure of the photoelectric conversion apparatus according to the first exemplary embodiment.
Figure 5B:
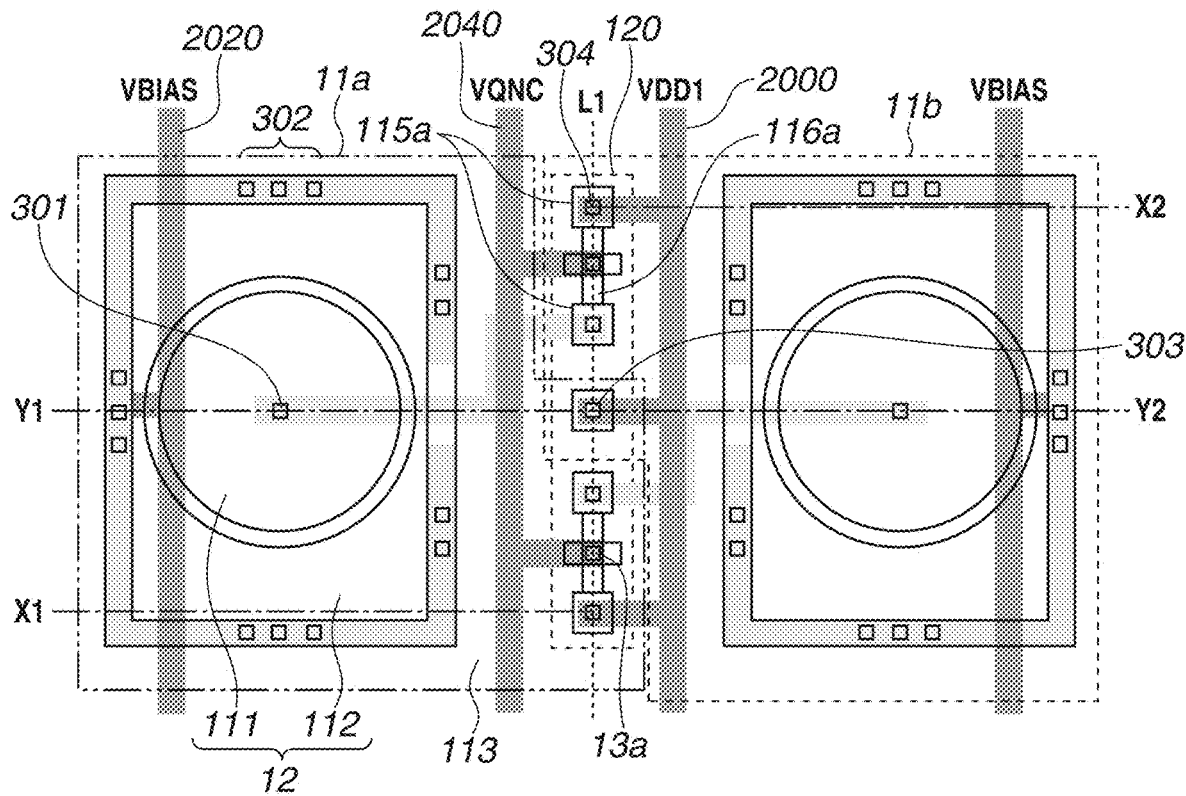

Next, a planar structure and a cross-sectional structure of the photoelectric conversion apparatus according to the present exemplary embodiment will be described with reference to FIGS. 5A and 5B. FIGS. 5A and 5B each illustrate a planar structure of the first semiconductor substrate 101, and omit a planar structure of the second semiconductor substrate 201.

FIG. 5A illustrates a planar layout diagram of a part of the first semiconductor substrate 101 of the photoelectric conversion apparatus according to the present exemplary embodiment. FIG. 5A schematically illustrates a planar structure of the first portion of each of the unit pixels 11a and 11b in one row and two columns. The other pixels 11 have similar planar structures.

FIG. 5B is a planar layout diagram illustrating the wiring layer included in the first wiring portion 107 in addition to the first semiconductor substrate 101 illustrated in FIG. 5A.

FIG. 6A schematically illustrates a cross-sectional structure along a dashed-and-dotted line X1-X2 in the photoelectric conversion apparatus illustrated in FIG. 5B. FIG. 6B schematically illustrates a cross-sectional structure along a dashed-dotted line Y1-Y2 in FIG. 5B. FIGS. 6A and 6B also illustrate the second semiconductor substrate 201.

A description will be given below with reference to FIGS. 5A, 5B, 6A, and 6B.

In FIG. 5A, the diode 12 included in the unit pixel 11a (hereinafter referred to as a first diode) and the diode 12 included in the unit pixel 11b (hereinafter referred to as a second diode) are arranged so as to be placed line-symmetrically with reference to a reference line LA. The reference line LA is, for example, a line passing through a midpoint of a line connecting a center of the first diode and a center of the second diode and extending perpendicularly to the line connecting the center of the first diode and the center of the second diode. Further, the reference line LA is, for example, a line connecting the first diode and the second diode at the shortest distance.

The transistor 13a forming the quench element 18 included in the unit pixel 11a (a first transistor) and the transistor 13a forming the quench element 18 included in the unit pixel 11b (a second transistor) are disposed between the first diode and the second diode. The first transistor and the second transistor are arranged line-symmetrically with respect to a line LB perpendicular to the reference line LA. The line LB perpendicular to the reference line LA is, for example, a line connecting the diode 12 and the diode 12.

The first transistor and the second transistor are arranged such that a channel length of the first transistor and a channel length of the second transistor are placed line-symmetrically with respect to a direction in which the first diode and the second diode are lined up. In other words, the first transistor and the second transistor are arranged so as to be placed line-symmetrically with respect to the reference line LA.

As illustrated in FIG. 5B, the power source line 2020, which supplies the potential VBIAS to the cathode of the diode 12, is provided for each unit pixel 11, and the power source line 2000, which supplies the voltage VDD1 to the anode of the diode 12, is shared by two unit pixels 11 in the present exemplary embodiment. More specifically, the power source line 2000 is disposed between the two diodes 12 and the power source lines 2020 are disposed at positions line symmetrical with respect to the reference line LA in a planar view. Owing to the configuration, the number of wirings can be reduced compared to when the power source line 2020 and the power source line 2000 are prepared for each unit pixel 11. Alternatively, the power source line 2020 may be shared by two unit pixels 11 and the power source line 2000 may be prepared for each unit pixel 11.

FIGS. 6A and 6B illustrate the first component 104, the second component 204, and a bonding surface 100 between the first component 104 and the second component 204. As described above, the first component 104 is formed by the first semiconductor substrate 101 and the first wiring portion 107.

In the first semiconductor substrate 101, a surface on which the first wiring portion 107 is formed is defined as a main surface 105, and a surface opposite thereto is defined as a back surface 106.

A semiconductor well region (hereinafter referred to as a well) 110 is provided within the first semiconductor substrate 101. The well 110 is, for example, an N-type semiconductor region. The diode 12 and a semiconductor well region 114 are disposed within the well 110. The well region 114 is, for example, a P-type semiconductor region.

The diode 12 includes an N-type semiconductor region 111 and a P-type semiconductor region 112. The N-type semiconductor region 111 corresponds the cathode of the above-described diode 12, and the P-type semiconductor region 112 corresponds to the anode of the above-described diode 12.

The well region 114 forms a part of the first transistor and a part of the second transistor. In other words, the channel of the first transistor and the channel of the second transistor are formed by well regions of the same conductivity type. The well region forming the channel of the first transistor and the well region forming the channel of the second transistor are formed by the single well region 114. Source regions and drain regions of the first transistor and the second transistor are formed within the well region 114.

As described above, the potential of 0 V to 3.3 V is applied to the PMOS transistor 13a while the potential of approximately −20 V is applied to the P-type semiconductor region 112 of the diode 12. Because of the large difference between the potentials applied to the diode 12 and the PMOS transistor 13a, the PMOS transistor 13a may be broken if the P-type semiconductor region 112 and the PMOS transistor 13a are located a short distance away from each other. Therefore, a certain length of distance should be secured between the P-type semiconductor region 112 and the PMOS transistor 13a. If the diode 12 and the PMOS transistor 14 of the unit pixel 11a, and the diode 12 and the PMOS transistor 14 of the unit pixel 11b are arranged in series on a straight line in the planar view, each of the unit pixels 11 increases in size. Therefore, this configuration makes integration of the diodes 12 difficult. According to the present exemplary embodiment, the PMOS transistors forming the quench elements 18 respectively connected to the diodes 12 are disposed between the diode 12 and the diode 12. The respective PMOS transistors 13a of the quench elements 18 are disposed in the common well region 114.

Therefore, according to the present exemplary embodiment, the integration of the diodes 12 can be achieved.

Further, as illustrated in FIG. 5A, the quench elements 18 (the PMOS transistors 13a) respectively connected to the diodes 12 are arranged such that a channel length of each of the quench elements 18 extends in parallel with the reference line LA. Therefore, the present exemplary embodiment can further facilitate the integration of the diodes 12.

The diode 12 of the unit pixel 11a, the diode 12 of the unit pixel 11b, and the well region 114 are arranged on a straight line in the planar view.

An element isolation region 113 is formed between the diode 12 and the well region 114. An active region and an inactive region (a field region) are separated by the element isolation region 113. The element isolation region 113 is formed by, for example, an N-type semiconductor region or an insulator.

A length L2 of the element isolation region 113 provided between the diode 12 and the quench element 18 (a first isolation region) is longer than a length L3 of an element isolation region provided between the quench element 18 and the quench element 18 (a second isolation region) on the main surface 105 of the first semiconductor substrate 101. According to the present exemplary embodiment, the length L3 of the element isolation region between the quench elements 18 can be made shorter than the length L2 between the diode 12 and the quench element 18, so that the integration of the diodes 12 can be achieved.

A gate electrode 116, which forms a part of the PMOS transistor 13a, is disposed on the main surface 105 of the first semiconductor substrate 101. Further, the first wiring portion 107 is disposed on a surface of the gate electrode 116 opposite to a surface on which the gate electrode 116 is disposed in the first semiconductor substrate 101, and on the main surface 105 of the first semiconductor substrate 101. The first wiring portion 107 includes a first wiring layer 121, a second wiring layer 122, and a third wiring layer 123. A connection between the wiring of the first wiring layer 121 and the wiring of the second wiring layer 122, and a connection between the gate electrode and the wiring of the first wiring layer 121 are established by, for example, a plug made of tungsten.

The N-type semiconductor region 111 forming the diode 12 is connected to the wiring via a plug 301. The plug 301 is in contact with the N-type semiconductor region 111 and the wiring. The P-type semiconductor region 112 forming the diode 12 is connected to the wiring via a plug 302. When light is incident on the diode 12, the plurality of electrons generated by the avalanche multiplication is read out to the plug 301 via the N-type semiconductor region 111. Then, the electrons are read out to the pixel circuit via the plug 301.

The first semiconductor substrate 101 includes a color filter layer 130 and a microlens 131 disposed on the back surface 106 of the first semiconductor substrate 101. The color filter layer 130 may include a planarization layer.

In the second semiconductor substrate 201, a surface on which the transistors are formed is defined as a main surface 205, and a surface opposite thereto is defined as a back surface 206. The second wiring portion 207 is disposed on the main surface 205 of the second semiconductor substrate 201. The second wiring portion 207 includes a first wiring layer 221 and a second wiring layer 222. An N-type well region 214 forming the transistor, a P-type well region 217, a source/drain region 215, a gate electrode 216, and an element isolation region 213 are disposed within a well 220 of the second semiconductor substrate 201. A connection between the wiring of the first wiring layer 221 and the wiring of the second wiring layer 222, a connection between the gate electrode and the wiring of the first wiring layer 221, and the like are established by, for example, a plug made of tungsten.

In the photoelectric conversion apparatus according to the present exemplary embodiment, the respective substrates of the first component 104 and the second component 204 are stacked with the main surface 105 and the main surface 205 thereof facing each other. The wiring of the third wiring layer 123 of the first wiring portion 107 of the first component 104, and the wiring of the second wiring portion 207 of the second component 204 secure an electric connection therebetween by contacting each other on the bonding surface 100. A connection portion 400 formed by the wiring of the third wiring layer 123 and the wiring of the second wiring layer 222 is placed at even intervals in each of the unit pixels 11. Thus, electric connection can be easily acquired when the first component 104 and the second component 204 are stacked. FIGS. 6A and 6B illustrate only the connection between the N-type semiconductor region 111 of the diode 12, and the transistor and the gate electrode 216 of the second semiconductor substrate 201, functioning as a plug between the first component 104 and the second component 204. The photoelectric conversion apparatus according to the present exemplary embodiment is the back-side-illuminated photoelectric conversion apparatus, on which light is incident from the back surface 106 side of the first semiconductor substrate 101.

Further, in the present exemplary embodiment, the quench element 18 and the inverter circuit 16 are correspondingly provided with respect to each of the diodes 12. The microlens 131 is provided corresponding to the diode 12. Further, the microlens 131 is provided also corresponding to the transistor 13a forming the quench element 18. In this case, the microlens 131 is provided so as to overlap with the transistor 13a in the planar view. Each of the members illustrated in FIGS. 5A, 5B, 6A, and 6B is schematically illustrated, and the N-type semiconductor region 111 and the P-type semiconductor region 112 forming the diode 12 may be configured to have a much larger area. The diode 12 is arranged such that the light transmitted through the microlens 131 is incident thereon.

Features and Advantageous Effects of Present Exemplary Embodiment

In the photoelectric conversion apparatus according to the present exemplary embodiment, the well region 114 is disposed between the diode 12 of the unit pixel 11a and the diode 12 of the unit pixel 11b. The transistor 13a forming the quench element 18 of each of the unit pixels 11a and 11b is disposed in the well region 114. Owing to this configuration, the present exemplary embodiment can reduce the length of the element isolation region 113 between the diode 12 and the transistor 13a compared to a case where the well region 114 in which the quench element 18 is disposed is not shared by the unit pixels 11a and 11b. In other words, according to the present exemplary embodiment, the diodes 12 can be laid out to be integrated.

A second exemplary embodiment will be described with reference to FIGS. 7 to 9. The present exemplary embodiment is similar to the first exemplary embodiment in that the first semiconductor substrate 101 and the second semiconductor substrate 201 are stacked, and the quench element 18 is disposed in the first semiconductor substrate 101. However, the present exemplary embodiment is different from the first exemplary embodiment in that the pulse shaping circuit is disposed in the first semiconductor substrate 101. Further, the present exemplary embodiment is different from the first exemplary embodiment in that the quench elements 18 included in the four unit pixels 11a to 11d, respectively, are disposed in a common well region.

Equivalent Circuit Diagram

Figure 7:
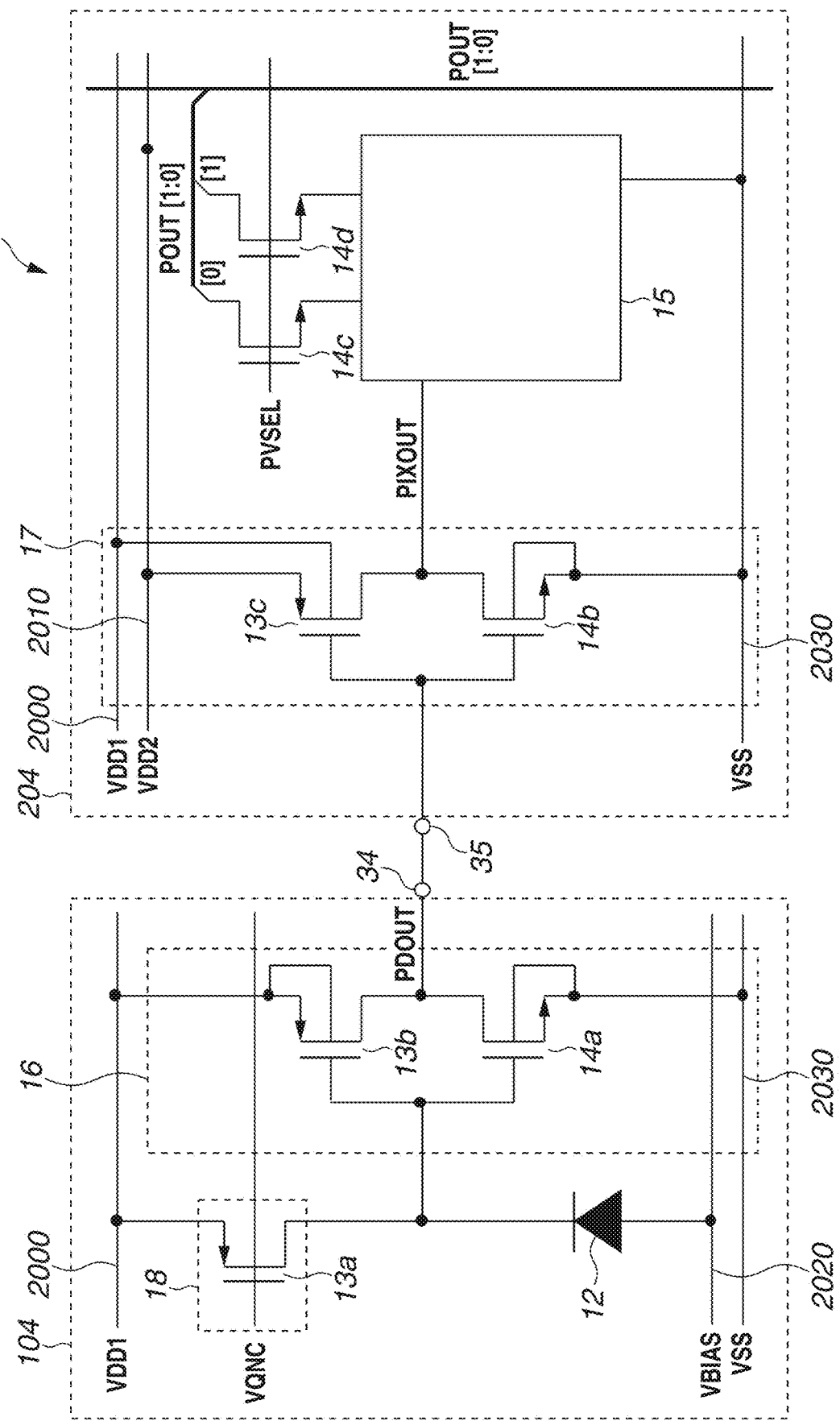
FIG. 7 is an equivalent circuit diagram of a photoelectric conversion apparatus according to a second exemplary embodiment.

FIG. 7 is an equivalent circuit diagram illustrating an example of a configuration of the unit pixel 11.

The output PDOUT from the inverter circuit 16 is transmitted to the second component 204 and input to the inverter circuit 17 via the first connection portion 34 and the second connection portion 35.

Planar View and Cross-Sectional View

Next, a planar structure and a cross-sectional structure of the photoelectric conversion apparatus according to the present exemplary embodiment will be described.

Figure 8A:
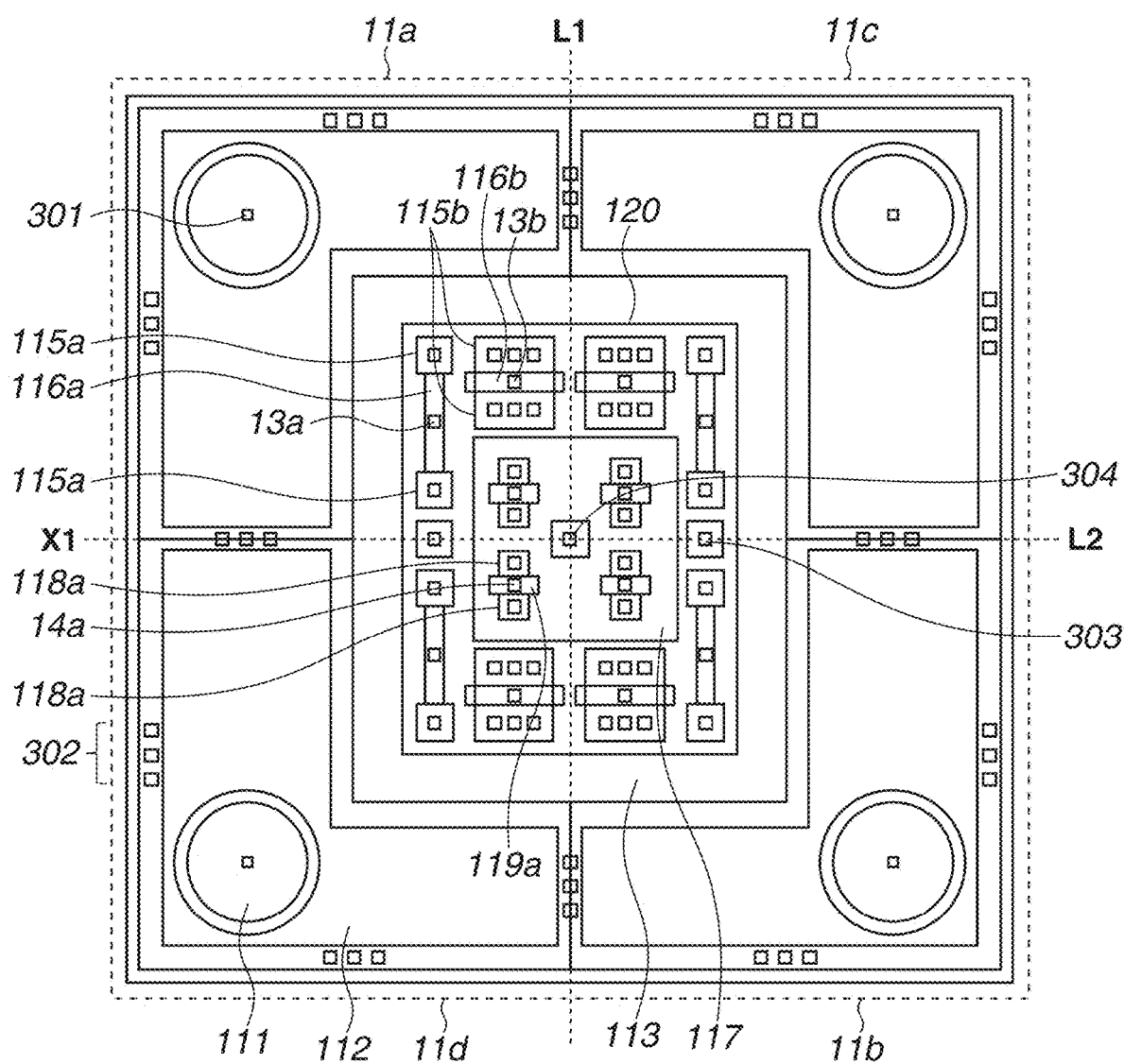
FIGS. 8A and 8B each illustrate a planar structure of the photoelectric conversion apparatus according to the second exemplary embodiment.
Figure 8B:
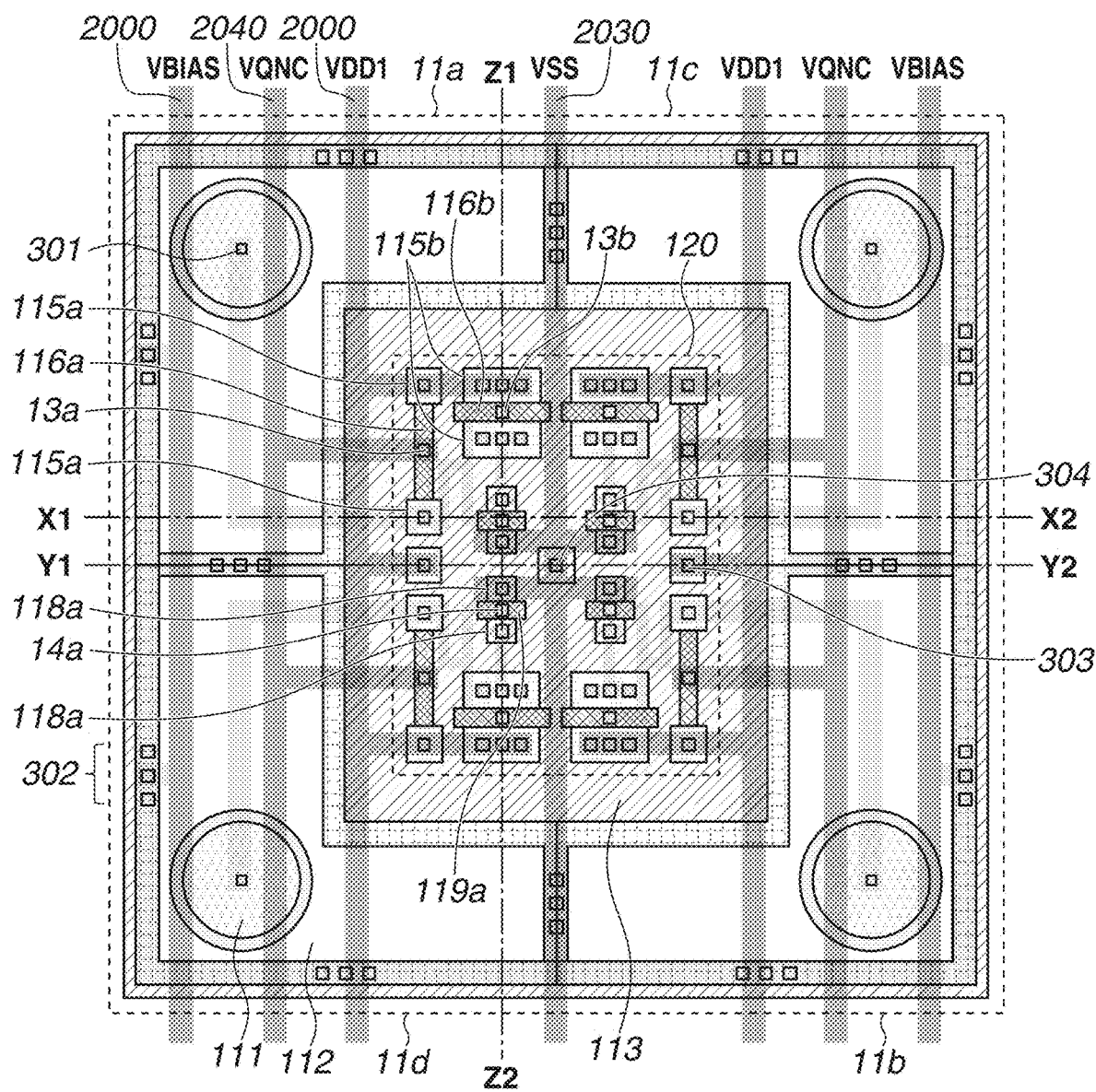

FIG. 8A schematically illustrates a planar structure of the first portion 104 of each of the unit pixels 11a, 11b, 11c, and 11d arranged in two rows and two columns in the photoelectric conversion apparatus according to the present exemplary embodiment. The other pixels 11 also have similar planar structures. FIG. 8A illustrates the planar structure of the first semiconductor substrate 101 and the gate electrode, and omits the planar structure of the second semiconductor substrate 201. FIG. 8B is a planar layout illustrating the wiring layer included in the first wiring portion 107 on the first semiconductor substrate 101 illustrated in FIG. 8A.

Figure 9C:
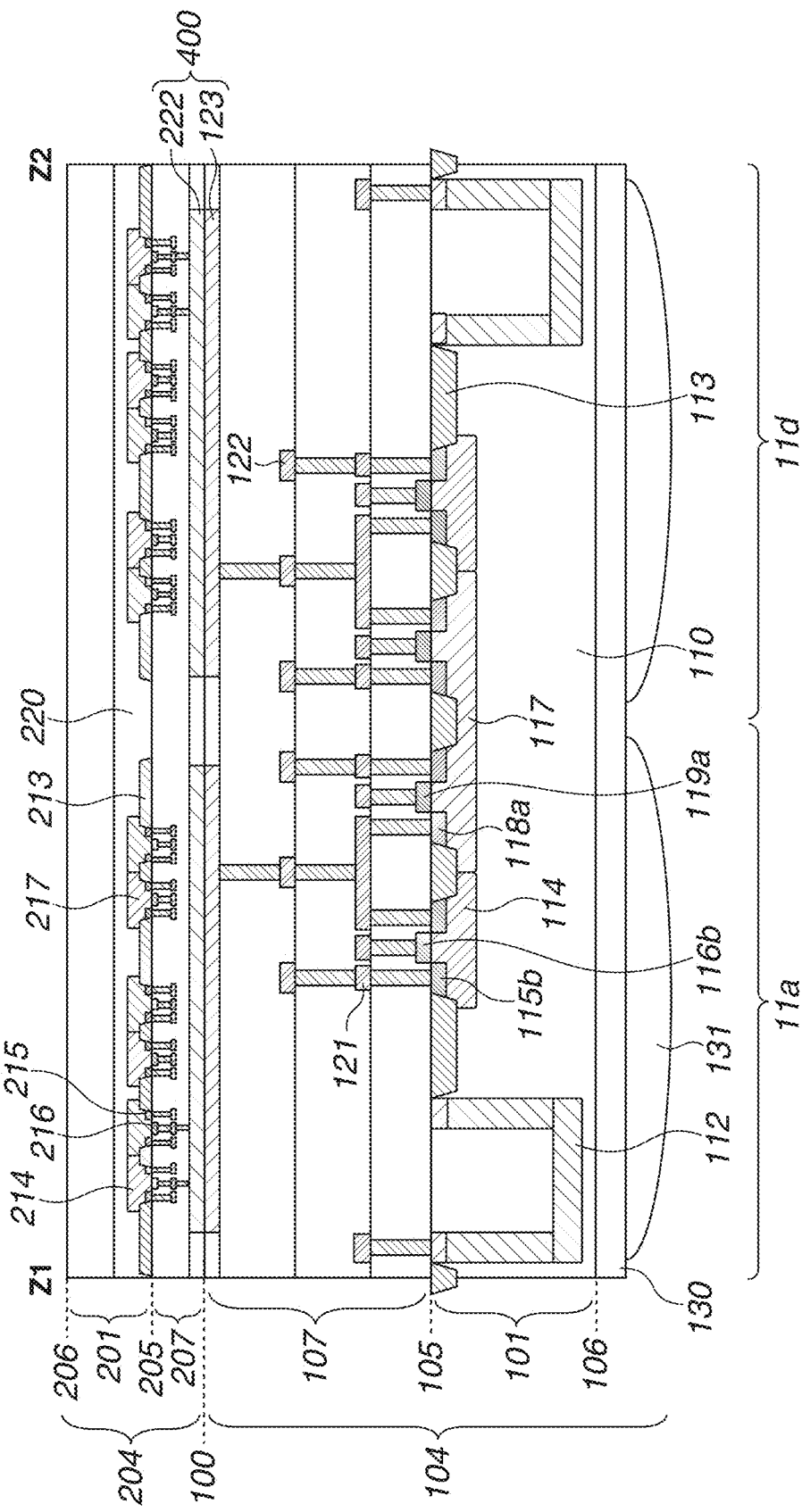

FIG. 9A schematically illustrates a cross-sectional structure along a dashed-dotted line X1-X2 in FIG. 8B. FIG. 9B schematically illustrates a cross-sectional structure along a dashed-dotted line Y1-Y2 in FIG. 8B. FIG. 9C schematically illustrates a cross-sectional structure along a dashed-dotted line Z1-Z2 in FIG. 8B. FIGS. 9A to 9C also illustrate the second semiconductor substrate 201.

A description will be given below with reference to FIGS. 8A, 8B, 9A, 9B, and 9C.

The well region 114 and a well region 117 that has a conductivity type different from the conductivity type of the well region 114 are disposed in the well 110. For example, the N-type well region 114 and the P-type well region 117 are disposed within the N-type well 110. The well region 114 is arranged so as to contact an outer periphery of the well region 117. Further, the semiconductor region 112 is arranged so as to surround an outer periphery of the well region 114. Laying out the regions in this manner can prevent a leak current between the P-type semiconductor region 112 forming the diode 12 and the well region 117.

A part of the transistor 13a forming the quench element 18 is disposed within the well region 114 as described above. Further, the transistor 13b of the second conductivity type, which forms a part of the inverter circuit 16, is disposed within the well region 114. The transistor 13b is a transistor using the above-described voltage VDD1, and is, for example, a PMOS transistor. A part of each of the transistors 13b of the unit pixels 11a, 11b, 11c, and 11d is disposed within the well region 114. In the present exemplary embodiment, parts of the four transistors 13b are disposed within the common well region 114.

A well contact portion 303 is provided in the well region 114. The power source line 2000 is electrically connected to the well region 114 via the wiring of each wiring layer. The voltage VDD1 is supplied to the well region 114.

A source/drain region 118a of the transistor 14a of the first conductivity type, which forms a part of the inverter circuit 16, is disposed in the well region 117. A channel of each of the transistors 13b of the unit pixels 11a to 11d is formed by the well region 117 of the same conductivity type. The transistor 14a includes a gate 119a. The transistor 14a is a transistor to which the voltage VSS is supplied. A transistor of each of the transistors 14a of the unit pixels 11a, 11b, 11c, and 11d is disposed within the well region 117. In the present exemplary embodiment, parts of the four transistors 14a are disposed within the common well region 117.

A well contact portion 304 is provided in the well region 117. The power source line 2030 is electrically connected to the well region 117 via the wiring of each wiring layer. The voltage VSS is supplied to the well region 117. The well contact portion 304 is shared among the unit pixels 11a, 11b, 11c, and 11d.

Further, in the present exemplary embodiment, the quench element 18 and the inverter circuit 16 are provided corresponding to each of the diodes 12. Therefore, as illustrated in FIGS. 9A, 9B, and 9C, the microlens 131 is provided corresponding to the diode 12, and, further, the microlens 131 is also provided corresponding to the quench element 18 and the transistor forming the inverter circuit 16. In this case, the microlens 131 is provided so as to overlap with the quench element 18 and the transistor forming the inverter circuit 16 in the planar view. Each of the members illustrated in FIGS. 8A, 8B, 9A, 9B, and 9C is schematically illustrated, and the N-type semiconductor region 111 and the P-type semiconductor region 112 forming the diode 12 may be configured to have a larger area. The diode 12 is arranged such that the light transmitted through the microlens 131 is incident thereon.

Features and Advantageous Effects of Present Exemplary Embodiment

In the photoelectric conversion apparatus according to the present exemplary embodiment, the well region 114 of the second conductivity type and the well region 117 of the first conductivity type are shared among the unit pixels 11a, 11b, 11c, and 11d. A part of the transistor 13a and a part of the transistor 13b of each of the unit pixels 11a, 11b, 11c, and 11d are disposed within the common well region 114. Further, the transistor 14a of each of the unit pixels 11a, 11b, 11c, and 11d is disposed within the common well region 117. Owing to this configuration, the present exemplary embodiment can reduce the length of the element isolation region 113 between the P-type semiconductor region 112 forming the diode 12 and the well region 114 compared to a case where the well region 114 and the well region 117 are not shared among the unit pixels 11a, 11b, 11c, and 11d. Further, the present exemplary embodiment can reduce the length of the element isolation region 113 between the well region 114 and the well region 117. In other words, according to the present exemplary embodiment, the unit pixels 11a, 11b, 11c, and 11d can be highly integrated.

Exemplary Modification of Second Exemplary Embodiment

Figure 10:
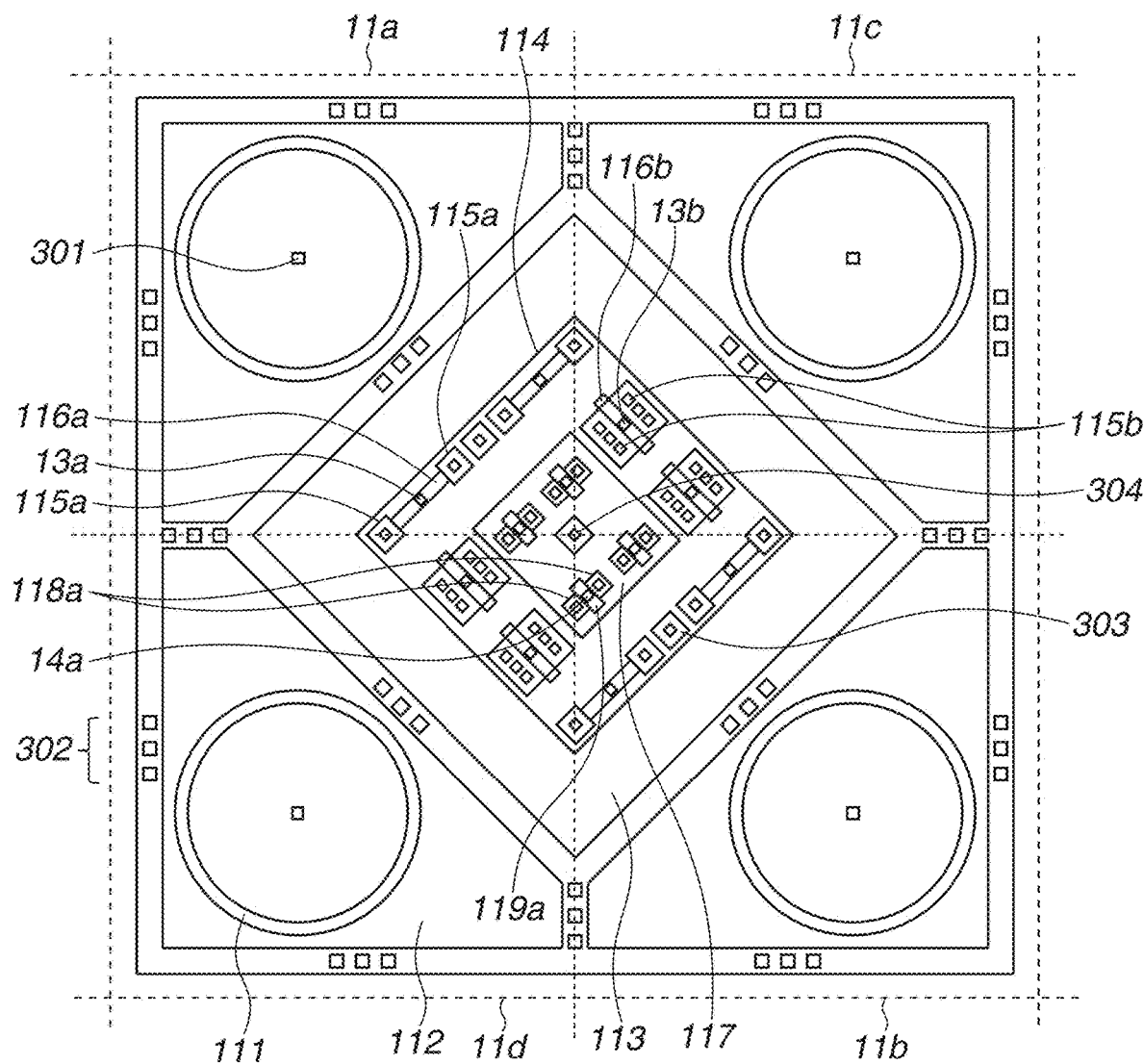
FIG. 10 illustrates a planar structure regarding an exemplary modification of the photoelectric conversion apparatus according to the second exemplary embodiment.

FIG. 10 illustrates another layout example of the above-described diode 12, well region 114, and well region 117. The power source lines are omitted in FIG. 10.

The well region 114 and the well region 117 illustrated in FIG. 10 are arranged so as to be rotated by 45 degrees in the row and column directions. In other words, the boundary line with the element isolation region 113 disposed between the first diode and the well region 114 perpendicularly intersects with the line connecting the first diode and the second diode in the planar view. By employing such a layout, the present exemplary embodiment can reduce the distance from the center of the semiconductor region 111 of the diode 12 to the well region 114 compared to a case where the well region 114 and the well region 117 are not rotated by 45 degrees in the row and column directions. In other words, the present exemplary embodiment can achieve the high integration of the unit pixels 11a, 11b, 11c, and 11d.

A third exemplary embodiment will be described with reference to FIGS. 11 to 13. The present exemplary embodiment is different from the first exemplary embodiment and the second exemplary embodiment in that the diode 12 and all the readout circuits are disposed in the first semiconductor substrate 101 and the unit pixel 11 is formed only by the first component 104.

Figure 11:
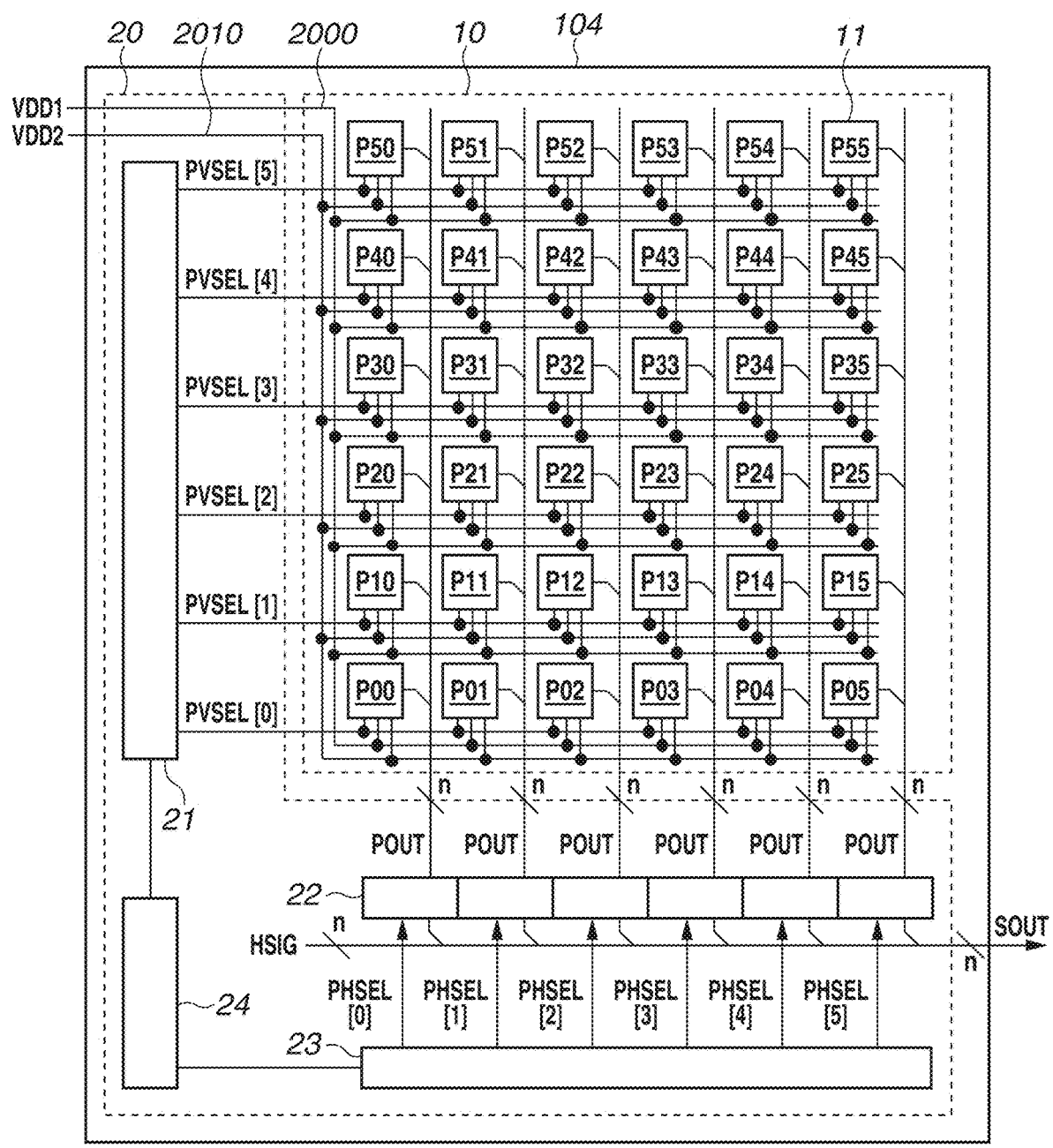
FIG. 11 illustrates a configuration of a photoelectric conversion apparatus according to a third exemplary embodiment.

FIG. 11 illustrates a configuration of the first component 104. The sensor portion 10 and the circuit portion 20 are disposed in the first semiconductor substrate 101.

Equivalent Circuit

Figure 12:
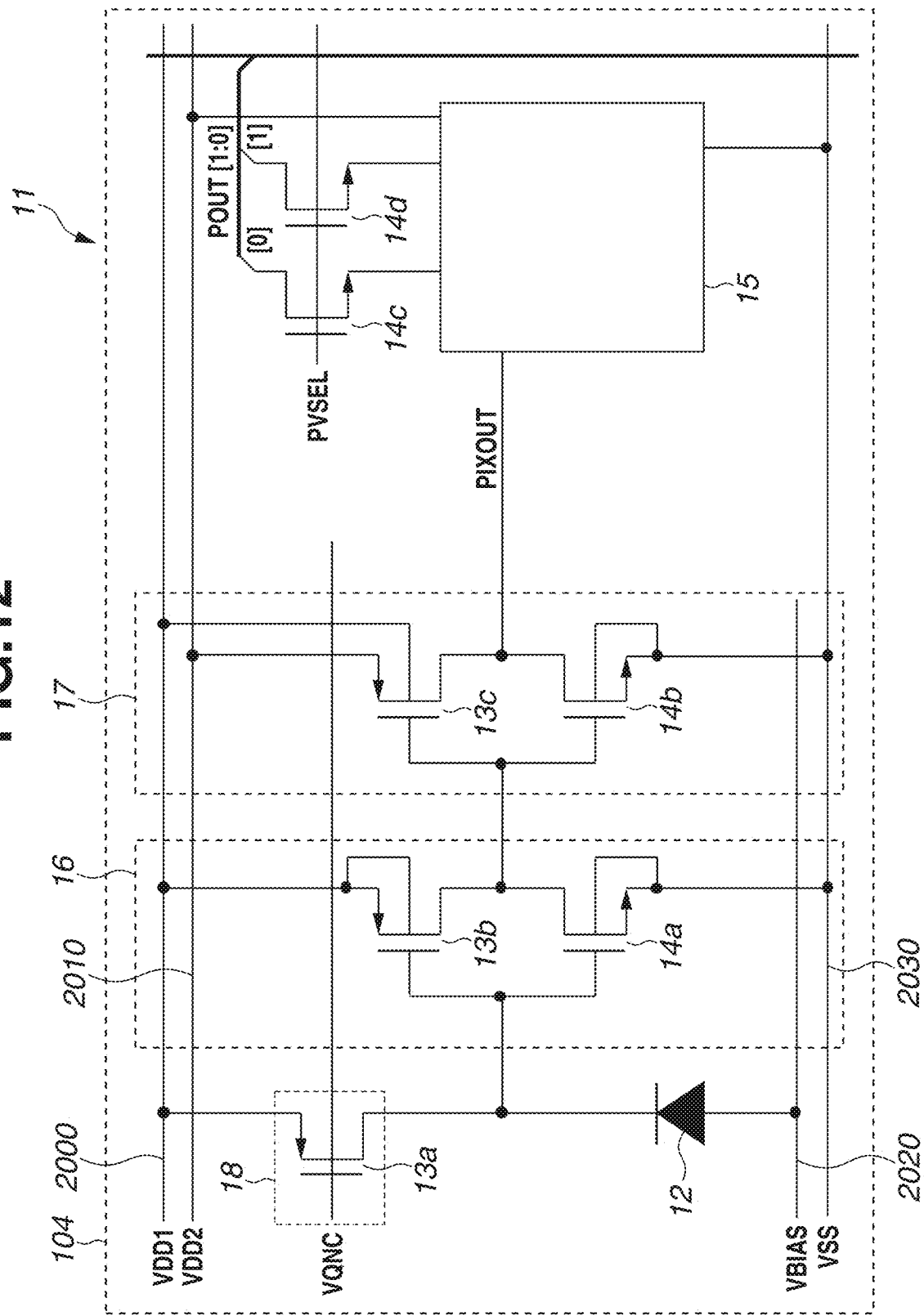
FIG. 12 is an equivalent circuit diagram of the photoelectric conversion apparatus according to the third exemplary embodiment.

FIG. 12 is an equivalent circuit illustrating an example of a configuration of the unit pixel 11.

The inverter circuit 16 (the pulse shaping circuit) inverts and amplifies the change in the potential at the cathode of the diode 12, and shapes a signal indicating whether a photon is incident, into the pulse signal.

The inverter circuit 17 converts the amplitude of the output from the inverter circuit 16.

The output PIXOUT from the inverter circuit 17 is received by the counter circuit 15. The counter circuit 15 counts the number of pulses output from the inverter circuit 17. The counter circuit 15 outputs the cumulated count result to the output signal line POUT via the switch of the NMOS transistors 14c and 14d.

Planar View

Figure 13:
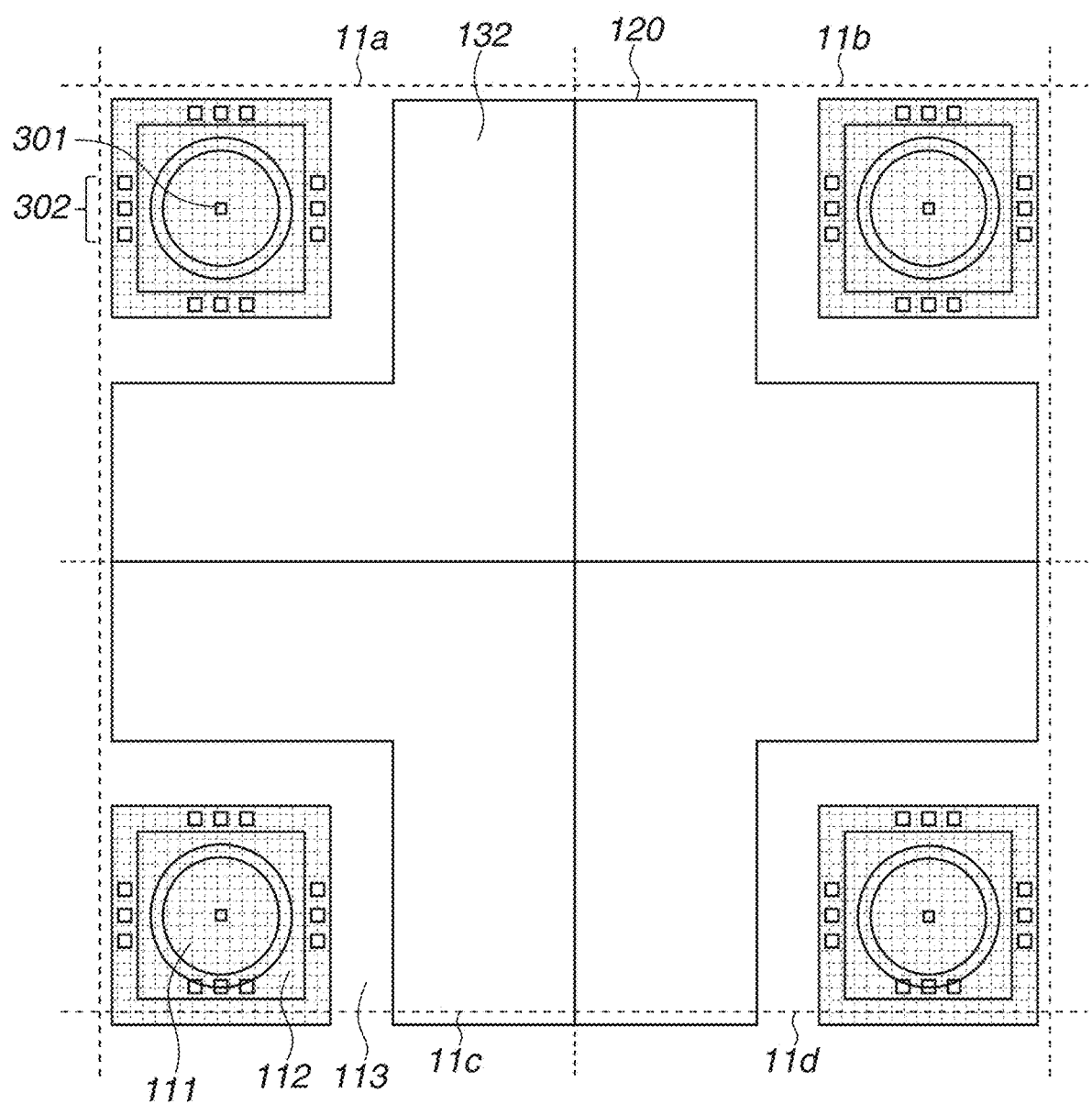
FIG. 13 illustrates a planar structure of the photoelectric conversion apparatus according to the third exemplary embodiment.

FIG. 13 schematically illustrates a planar structure of the unit pixels 11a, 11b, 11c, and 11d arranged in two rows and two columns in the photoelectric conversion apparatus according to the present exemplary embodiment. The other pixels 11 also have similar planar structures. The power source lines and the transistors are omitted in FIG. 13.

The transistor 13a forming the quench element 18, the transistors 13b and 14a forming the inverter circuit 16, the transistors 13c and 14b forming the inverter circuit 17, the transistor forming the counter circuit 15, and the transistors 14c and 14d are disposed in a circuit region 132.

The well region 114 and the well region 117 are disposed within a well region 120 similarly to FIGS. 8A and 8B. The well region 114 and the well region 117 are shared among the unit pixels 11a, 11b, 11c, and 11d.

Features and Advantageous Effects of Present Exemplary Embodiment

In the photoelectric conversion apparatus according to the present exemplary embodiment, the well region 114 and the well region 117 are shared among the two unit pixels 11a, 11b, 11c, and 11d. The transistors 13a to 13c of each of the unit pixels 11a, 11b, 11c, and 11d share the well region 114 among them. Further, the transistors 14a to 14d and the transistor forming the counter circuit 15 share the well region 117 among them. Owing to this configuration, the present exemplary embodiment can reduce the length of the element isolation region 113 between the well region 114 and the diode 12 compared to a case where the well region 114 and the well region 117 are not shared among the unit pixels 11a, 11b, 11c, and 11d. In other words, the present exemplary embodiment can achieve the high integration of the unit pixels 11a, 11b, 11c, and 11d.

Figure 14:
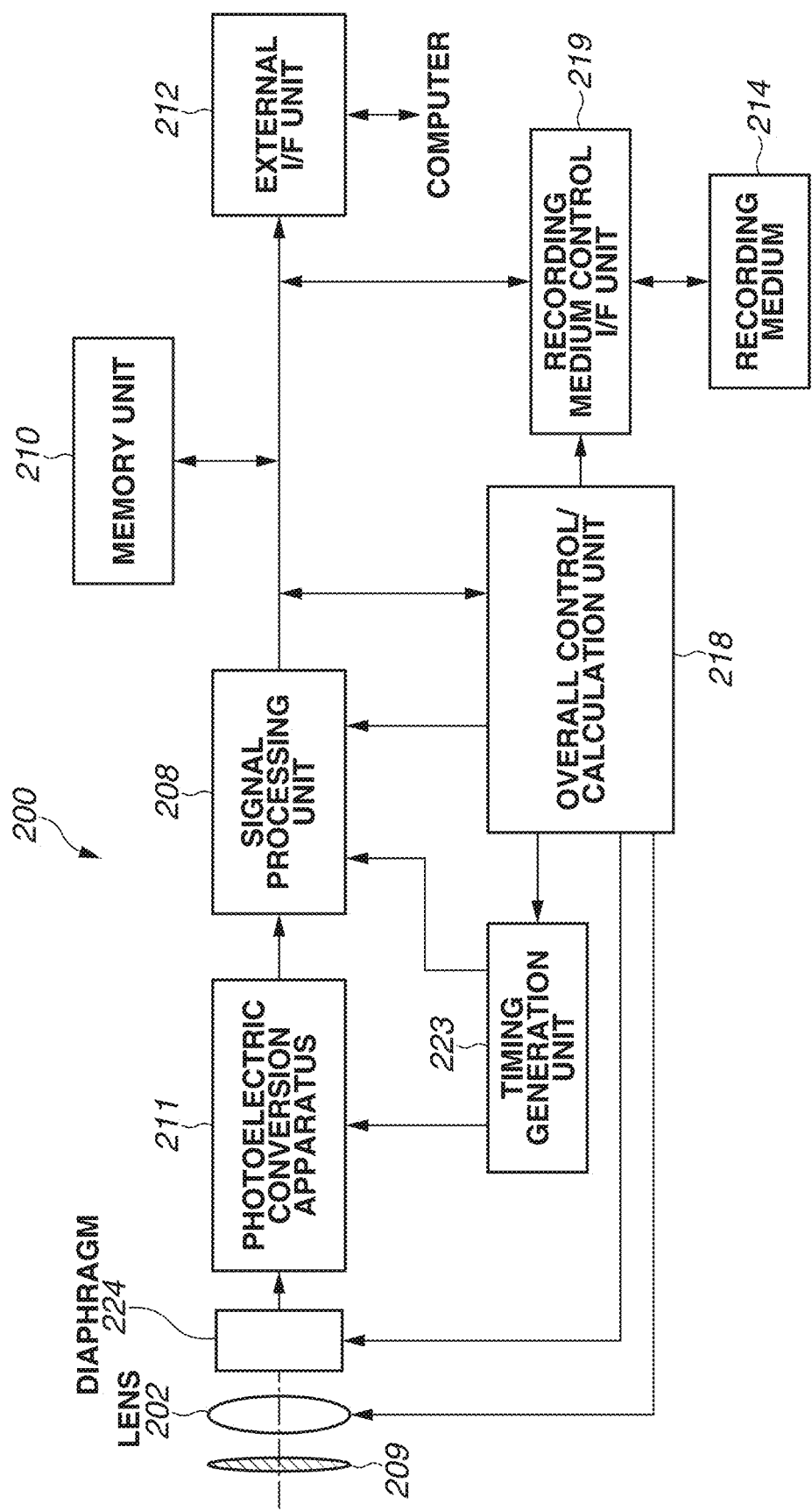
FIG. 14 is a block diagram of a photoelectric conversion system according to a fourth exemplary embodiment.

A photoelectric conversion system according to a fourth exemplary embodiment will be described with reference to FIG. 14. The present exemplary embodiment will be described assigning the same reference numerals to similar configurations to the photoelectric conversion apparatus according to each of the above-described exemplary embodiments, and the descriptions thereof are omitted or simplified. FIG. 14 is a block diagram illustrating a schematic configuration of the photoelectric conversion system according to the present exemplary embodiment.

The photoelectric conversion apparatuses described in each of the above-described exemplary embodiments are applicable to various photoelectric conversion systems as a photoelectric conversion apparatus 211 illustrated in FIG. 14. Examples of the photoelectric conversion system to which the photoelectric conversion apparatus is applicable include a digital still camera, a digital camcorder, a monitoring camera, a copying machine, a facsimile machine, a mobile phone, an in-vehicle camera, and an observatory satellite. Further, the examples of the photoelectric conversion system also include a camera module including an optical system such as a lens and the photoelectric conversion apparatus. FIG. 14 illustrates a block diagram of the digital still camera as an example of them.

A photoelectric conversion system 200 illustrated as an example in FIG. 14 includes the photoelectric conversion apparatus 211, a lens 202 for forming an optical image of a subject on the photoelectric conversion apparatus 211, a diaphragm 224 for allowing light to pass through the lens 202 by a variable light amount, and a barrier 209 for protecting the lens 202. The lens 202 and the diaphragm 224 are an optical system that collects the light onto the photoelectric conversion apparatus 211. The photoelectric conversion apparatus 211 is the photoelectric conversion apparatus described in each of the first to third exemplary embodiments, and converts the optical image formed by the lens 202 into image data.

The photoelectric conversion system 200 further includes a signal processing unit 208, which processes a signal output from the photoelectric conversion apparatus 211. The signal processing unit 208 carries out various kinds of corrections and compressions as necessary and outputs the image data. A part of the signal processing unit 208 may be formed on a semiconductor substrate where the photoelectric conversion apparatus 211 is mounted or may be formed on a semiconductor substrate of an apparatus different from the photoelectric conversion apparatus 211. Further, the photoelectric conversion apparatus 211 and the signal processing unit 208 may be formed on the same semiconductor substrate.

The photoelectric conversion system 200 further includes a memory unit 210 for temporarily storing the image data, and an external interface unit (an external I/F unit) 212 for communicating with an external computer and the like. The photoelectric conversion system 200 further includes a recording medium 219 such as a semiconductor memory for recording or reading out imaging data, and a recording medium control interface unit (a recording medium control I/F unit) 216 for recording the imaging data into or reading out from the recording medium 219. The recording medium 219 may be built in the photoelectric conversion system 200 or may be detachably mounted.

The photoelectric conversion system 200 further includes an overall control/calculation unit 218, which controls various kinds of calculations and the entire digital still camera, and a timing generation unit 223, which outputs various kinds of timing signals to the photoelectric conversion apparatus 211 and the signal processing unit 208. However, the timing signal and the like may be input from the outside of the photoelectric conversion system 200. The photoelectric conversion system 200 may have any configurations as long as the photoelectric conversion system 200 includes at least the photoelectric conversion apparatus 211, and the signal processing unit 208 that processes the signal output from the photoelectric conversion apparatus 211.

The photoelectric conversion apparatus 211 outputs an imaging signal to the signal processing unit 208. The signal processing unit 208 performs predetermined signal processing on the imaging signal output from the photoelectric conversion apparatus 211, and outputs the image data. The signal processing unit 208 generates an image by using the captured image signal.

A photoelectric conversion system capable of stably acquiring a high-quality image with a high sensitivity and a large saturation signal amount can be realized by employing the photoelectric conversion apparatus according to each of the above-described exemplary embodiments.

A photoelectric conversion system and a moving object according to a fifth exemplary embodiment will be described with reference to FIGS. 15A and 15B.

Figure 15A:
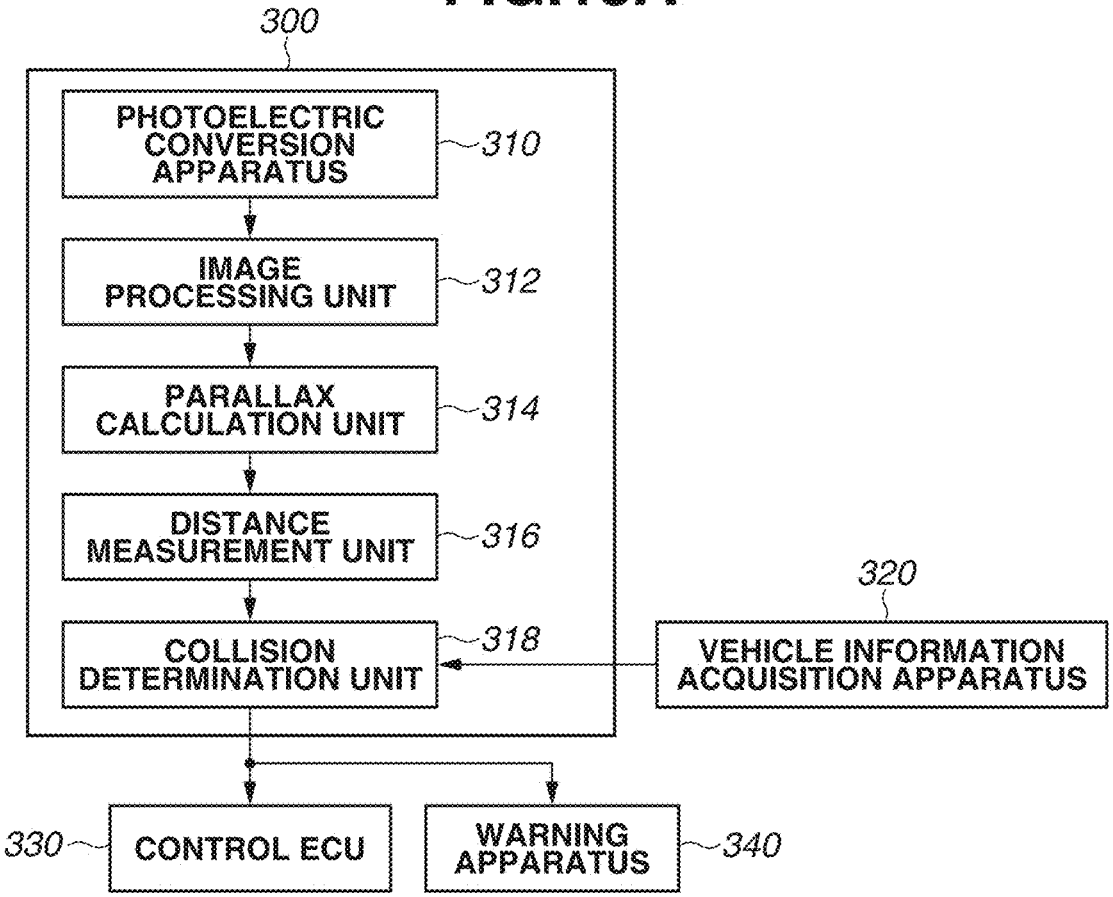
FIGS. 15A and 15B each illustrate a configuration of a moving object according to a fifth exemplary embodiment.
Figure 15B:
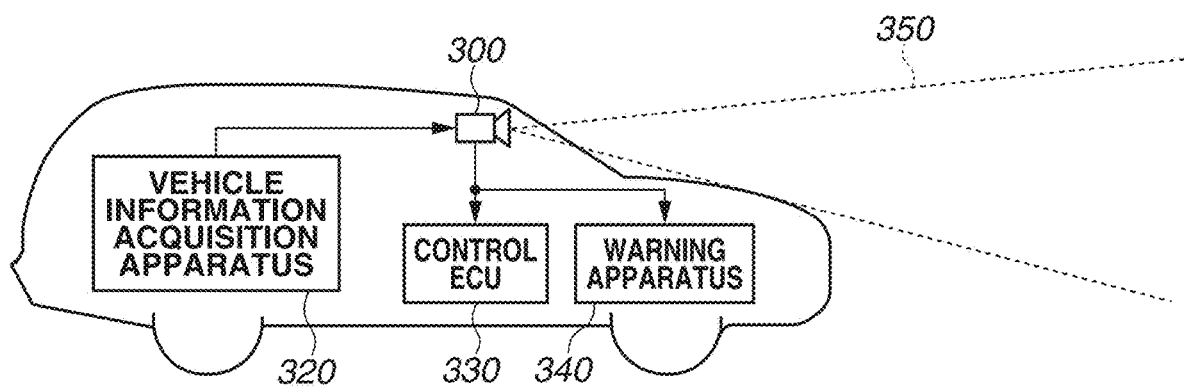

FIG. 15A illustrates an example of a photoelectric conversion system regarding the in-vehicle camera. A photoelectric conversion system 300 includes a photoelectric conversion apparatus 310. The photoelectric conversion apparatus 310 is the apparatus described in each of the above-described first to third exemplary embodiments. The photoelectric conversion system 300 includes an image processing unit 312, which performs image processing on a plurality of pieces of image data acquired by the photoelectric conversion apparatus 310, and a parallax calculation unit 314, which calculates a parallax (a phase difference between parallax images) from the plurality of pieces of image data acquired by the photoelectric conversion system 300. Further, the photoelectric conversion system 300 includes a distance measurement unit 316, which calculates a distance to a target based on the calculated parallax, and a collision determination unit 318, which determines whether there is a collision possibility based on the calculated distance. The parallax calculation unit 314 and the distance measurement unit 316 are an example of a distance information acquisition unit that acquires information about distance to the target. In other words, the distance information refers to information regarding the parallax, a defocus amount, the distance to the target, or the like. The collision determination unit 318 may determine the collision possibility by using any of these pieces of distance information. The distance information acquisition unit may be realized by specially designed hardware or may be realized by a software module. Alternatively, the distance information acquisition unit may be realized by a field programmable gate array (FPGA), an application specific integrated circuit (ASIC), or the like, or may be realized by a combination of them.

The photoelectric conversion system 300 is connected to a vehicle information acquisition apparatus 320, and can acquire vehicle information, such as a vehicle speed, a yaw rate, and a steering angle. Further, the photoelectric conversion system 300 is connected to an electronic control unit (ECU) 330, which is a control apparatus that outputs a control signal for generating a braking force for the vehicle based on a result of the determination by the collision determination unit 318. Further, the photoelectric conversion system 300 is connected to a warning apparatus 340, which issues a warning to a driver based on the result of the determination by the collision determination unit 318. For example, when the collision possibility is high as the result of the determination by the collision determination unit 318, the control ECU 330 controls the vehicle so as to avoid the collision or reduce damage by, for example, putting on the brake to the vehicle, returning an accelerator, and/or reducing an engine power output. The warning apparatus 340 warns the user by, for example, producing a warning such as a sound, displaying warning information on a screen of a car navigation system or the like, or vibrating a seat belt or a steering wheel.

In the present exemplary embodiment, surroundings of the vehicle, such as a front or rear of the vehicle, are imaged by the photoelectric conversion system 300. FIG. 15B illustrates the photoelectric conversion system 300 when it captures the image in front of the vehicle (an imaging range 350). The vehicle information acquisition apparatus 320 issues an instruction to the photoelectric conversion system 300 or the photoelectric conversion apparatus 310 so as to perform a predetermined operation. Owing to such a configuration, the distance can be measured with improved accuracy.

In the above description, the photoelectric conversion system has been described referring to the example that performs control so as to prevent the vehicle from colliding with another vehicle, but is also applicable to control for autonomously driving the vehicle so as to cause the vehicle to follow the other vehicle, control for autonomously driving the vehicle so as to prevent the vehicle from departing from a traffic lane, and the like. Further, the photoelectric conversion system is applicable to not only the vehicle such as a car on which the photoelectric conversion system itself is mounted, but also a moving object (a moving apparatus) such as a ship, an airplane, or an industrial robot. In addition, the photoelectric conversion system is widely applicable to not only the moving object but also an apparatus using object recognition, such as an intelligent transportation system (ITS).

According to the present disclosure, the high integration of the diodes can be achieved in the photoelectric conversion apparatus in which the diode and the quench element are mixed in the same semiconductor substrate.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-034287, filed Feb. 27, 2019, which is hereby incorporated by reference herein in its entirety.

What is claimed is:

1. A photoelectric conversion apparatus comprising:
a first semiconductor substrate;
a second semiconductor substrate;
a first diode which is an avalanche multiplication-type and a second diode which is an avalanche multiplication-type formed within the first semiconductor substrate;
a first transistor forming a first quench element connected to the first diode;

a second transistor forming a second quench element connected to the second diode;
a pulse shaping circuit configured to shape an output from the first diode into a pulse; and
a counter circuit configured to process a signal corresponding to an output from the pulse shaping circuit,
wherein the first semiconductor substrate and the second semiconductor substrate are stacked,
wherein the counter circuit is disposed in the second semiconductor substrate,
wherein the first transistor and the second transistor are disposed between the first diode and the second diode in a planar view, and
wherein a part of the first transistor and a part of the second transistor are disposed in a common first semiconductor well region formed in the first semiconductor substrate.

2. The photoelectric conversion apparatus according to claim 1, wherein the first diode, the second diode, and the first semiconductor well region are arranged on a straight line in the planar view.

3. The photoelectric conversion apparatus according to claim 2, wherein the first diode and the second diode are arranged line-symmetrically with respect to a reference line in the planar view, and
wherein the first transistor and the second transistor are arranged line-symmetrically with respect to a line perpendicular to the reference line in the planar view.

4. The photoelectric conversion apparatus according to claim 3, wherein the reference line is a line connecting a center of the first diode and a center of the second diode.

5. The photoelectric conversion apparatus according to claim 3, wherein the reference line is a line connecting the first diode and the second diode at the shortest distance.

6. The photoelectric conversion apparatus according to claim 1, further comprising:
a third diode and a fourth diode each being of an avalanche multiplication-type and each being formed in the first semiconductor substrate;
a third transistor forming a third quench element connected to the third diode; and
a fourth transistor forming a fourth quench element connected to the fourth diode,
wherein the first diode and the second diode are lined up in a first direction in the planar view,
wherein the third diode and the fourth diode are lined up in a second direction perpendicular to the first direction in the planar view, and
wherein a part of the third transistor and a part of the fourth transistor are formed in the common first semiconductor well region.

7. The photoelectric conversion apparatus according to claim 1, wherein a first isolation region is provided between a first semiconductor region of a second conductivity type that forms the first diode, and the first semiconductor well region in the planar view, and
wherein a boundary line between the first isolation region and the first semiconductor region is perpendicular to a line connecting the first diode and the second diode in the planar view.

8. The photoelectric conversion apparatus according to claim 1, wherein a first isolation region is provided between a first semiconductor region of a second conductivity type that forms the first diode, and the first semiconductor well region in the planar view,
wherein at least one second isolation region is provided between the first transistor and the second transistor, and
wherein a length of the second isolation region is shorter than a length of the first isolation region.

9. The photoelectric conversion apparatus according to claim 1, wherein the first semiconductor well region is a semiconductor region of a first conductivity type, which is the same as a signal charge.

10. The photoelectric conversion apparatus according to claim 9, further comprising:
a second semiconductor well region disposed in the first semiconductor substrate and having a second conductivity type,
wherein the pulse shaping circuit includes a fifth transistor including a source and a drain of the first conductivity type, and a sixth transistor including a source and a drain of the second conductivity type, and
wherein the source and the drain of the sixth transistor are formed in the first semiconductor well region, and the source and the drain of the fifth transistor are formed in the second semiconductor well region.

11. The photoelectric conversion apparatus according to claim 10, wherein the first semiconductor well region is arranged so as to surround the second semiconductor well region in the planar view.

12. The photoelectric conversion apparatus according to claim 1, further comprising:
a counter circuit formed in the first semiconductor substrate,
wherein a part of at least one of transistors included in the counter circuit is formed in the first semiconductor well region.

13. The photoelectric conversion apparatus according to claim 1, wherein the pulse shaping circuit is disposed in the second semiconductor substrate.

14. The photoelectric conversion apparatus according to claim 13, wherein the pulse shaping circuit includes,
a fifth transistor of a first conductivity type and a sixth transistor of a second conductivity type, and
a second semiconductor well region disposed in the first semiconductor substrate and of the second conductivity type,
wherein a part of the sixth transistor is formed in the first semiconductor well region, and
wherein a part of the fifth transistor is formed in the second semiconductor well region.

15. The photoelectric conversion apparatus according to claim 14, further comprising:
a first well contact portion connected to the first semiconductor well region,
wherein the first well contact portion is shared by a pixel including the first diode and a pixel including the second diode.

16. A photoelectric conversion system comprising:
the photoelectric conversion apparatus according to claim 15; and
a signal processing unit configured to process a signal output from the photoelectric conversion apparatus.

17. A moving object comprising:
the photoelectric conversion apparatus according to claim 15;
a distance information acquisition unit configured to acquire information about distance to a target, from a parallax image based on a signal from the photoelectric conversion apparatus; and a control unit configured to control the moving object based on the distance information.

18. A photoelectric conversion system comprising:
the photoelectric conversion apparatus according to claim 1; and
a signal processing unit configured to process a signal output from the photoelectric conversion apparatus.

19. A moving object comprising:
the photoelectric conversion apparatus according to claim 1;
a distance information acquisition unit configured to acquire information about distance to a target, from a parallax image based on a signal from the photoelectric conversion apparatus; and
a control unit configured to control the moving object based on the distance information.

* * * * *